(12) United States Patent
Kim et al.

(10) Patent No.: US 11,474,639 B2
(45) Date of Patent: Oct. 18, 2022

(54) ELECTRONIC DEVICE

(71) Applicant: Samsung Display Co., Ltd., Yongin-si (KR)

(72) Inventors: Yun-Ho Kim, Hwaseong-si (KR); Chul Kim, Hwaseong-si (KR); Jaeuk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/219,608

(22) Filed: Mar. 31, 2021

(65) Prior Publication Data
US 2022/0057911 A1    Feb. 24, 2022

(30) Foreign Application Priority Data

Aug. 18, 2020   (KR) .................. 10-2020-0103394

(51) Int. Cl.
*G06F 3/041*   (2006.01)
*H01L 27/32*   (2006.01)
(Continued)

(52) U.S. Cl.
CPC ...... *G06F 3/04166* (2019.05); *G06F 3/03545* (2013.01); *G06F 3/0412* (2013.01); *G06F 3/0446* (2019.05); *G06F 3/04162* (2019.05); *G06F 3/04164* (2019.05); *H01L 25/18* (2013.01); *H01L 27/323* (2013.01);
(Continued)

(58) Field of Classification Search
CPC ............... G06F 3/04166; G06F 3/0446; G06F 3/04164; G06F 3/04162; G06F 3/03545; G06F 3/0412; G06F 3/0383; G06F 2203/04111; G06F 2203/04112; H01L 25/18; H01L 27/323
See application file for complete search history.

(56) References Cited

U.S. PATENT DOCUMENTS 8,947,370 B2   2/2015   An et al.
9,830,025 B2   11/2017  Han et al.
(Continued)

FOREIGN PATENT DOCUMENTS

KR   10-1396937 B1   5/2014
KR   10-1451295 B1   10/2014
(Continued)

*Primary Examiner* — Towfiq Elahi
(74) *Attorney, Agent, or Firm* — Lewis Roca Rothgerber Christie LLP

(57) ABSTRACT

An electronic device includes: a sensor layer having an active area and a peripheral area; a driving chip electrically connected to the sensor layer, wherein the sensor layer comprises a plurality of sensing units on the active area and a plurality of lines on the peripheral area and respectively electrically connected to the plurality of sensing units, each of the plurality of sensing units comprises a plurality of sub sensing units, the plurality of sub sensing units comprise a first sub sensing unit and a second sub sensing unit, the plurality of lines comprise a first line electrically connected to the first sub sensing unit and a second line electrically connected to the second sub sensing unit, and the plurality of switches comprises a first switch connected between the first line and the second line and a second switch connected between the first line and the driving chip.

18 Claims, 14 Drawing Sheets

(51) Int. Cl.
*H01L 25/18* (2006.01)
*G06F 3/044* (2006.01)
*G06F 3/0354* (2013.01)
*G06F 3/038* (2013.01)

(52) U.S. Cl.
CPC .. *G06F 3/0383* (2013.01); *G06F 2203/04111* (2013.01); *G06F 2203/04112* (2013.01)

(56) References Cited

U.S. PATENT DOCUMENTS

| | | |
|---|---|---|
| 10,345,966 B2 | 7/2019 | Han |
| 2015/0286268 A1* | 10/2015 | Komatsu ............ G06F 3/04184 |
| | | 345/173 |
| 2018/0232101 A1* | 8/2018 | Fotopoulos .......... G06K 9/0002 |
| 2018/0321793 A1* | 11/2018 | Kim ................... G06F 3/04182 |
| 2019/0171314 A1* | 6/2019 | Hamaguchi ............. G06F 3/044 |
| 2019/0384441 A1* | 12/2019 | Seo ....................... G06F 3/0416 |

FOREIGN PATENT DOCUMENTS

| | | |
|---|---|---|
| KR | 10-2016-0029963 A | 3/2016 |
| KR | 10-1726623 B1 | 4/2017 |
| KR | 10-2078650 B1 | 2/2020 |
| KR | 10-2081606 B1 | 2/2020 |

* cited by examiner

ELECTRONIC DEVICE

CROSS-REFERENCE TO RELATED APPLICATION

The present application claims priority to and the benefit of Korean Patent Application No. 10-2020-0103394, filed on Aug. 18, 2020, the entire content of which is hereby incorporated by reference.

BACKGROUND

1. Field

Aspects of some embodiments of the present disclosure herein relate to an electric device having improved sensing reliability.

2. Description of the Related Art

Electronic devices may sense an external input applied from the outside of the electronic devices. The external input may be a user's input. The user's input may include various types of external inputs such as a portion of user's body, light, heat, a pen, a pressure, or the like. The electronic devices may recognize coordinates of the pen using an electromagnetic resonance (EMR) method or may recognize the coordinates of the pen using an active electrostatic (AES) method.

The above information disclosed in this Background section is only for enhancement of understanding of the background and therefore the information discussed in this Background section does not necessarily constitute prior art.

SUMMARY

Aspects of some embodiments according to the present disclosure include an electric device having relatively improved sensing reliability.

According to some embodiments of the inventive concept, an electronic device includes: a display layer; a sensor layer which is on the display layer and on which an active area and a peripheral area adjacent to the active area are defined; a driving chip electrically connected to the sensor layer; and a plurality of switches connected between the sensor layer and the driving chip, wherein the sensor layer includes a plurality of sensing units on the active area and a plurality of lines on the peripheral area and respectively electrically connected to the plurality of sensing units, each of the plurality of sensing units includes a plurality of sub sensing units arranged in a first direction and a second direction crossing the first direction, the plurality of sub sensing units include a first sub sensing unit and a second sub sensing unit spaced apart from the first sub sensing unit in the second direction, the plurality of lines comprise a first line electrically connected to the first sub sensing unit and a second line electrically connected to the second sub sensing unit, and the plurality of switches includes a first switch connected between the first line and the second line and a second switch connected between the first line and the driving chip.

According to some embodiments, the sensor layer may operate in a first mode or a second mode different from the first mode, in the first mode, the first switch may operate in an ON state, and the second switch operates in an OFF state, and in the second mode, the first switch may operate in an OFF state, and the second switch operates in an ON state.

According to some embodiments, the driving chip may include a plurality of first driving parts that operate in the first mode and a plurality of second driving parts that operate in the second mode.

According to some embodiments, in the first mode, the first line and the second line may be connected to each other, and in the second mode, the plurality of lines may be electrically connected to the plurality of second driving parts, respectively.

According to some embodiments, in the first mode, the sensor layer may sense an input based on each of the plurality of sensing units, and in the second mode, the sensor layer may sense an input based on each of the plurality of sub sensing units.

According to some embodiments, each of the plurality of sub sensing units may include an electrode and an crossing electrode that is insulately crossing with the electrode, the sensor layer may sense an input by touch through a change in mutual capacitance generated between the first electrode and the crossing electrode in the first mode, and the sensor layer may sense an input by an input device through a change in capacitance of each of the electrode and the crossing electrode in the second mode.

According to some embodiments, the crossing electrode may include: a first crossing portion extending in the second direction; and a plurality of second crossing portions protruding from the first crossing portion, wherein the electrode may include: a plurality of electrode patterns spaced apart from each other with the first crossing portion therebetween; and a bridge pattern insulately crossing with the first crossing portion and electrically connected to the plurality of electrode patterns.

According to some embodiments, the first crossing portion, the plurality of second crossing portions, and the plurality of electrode patterns may have a mesh structure.

According to some embodiments, the plurality of sub sensing units may further include a third sub sensing unit spaced apart from the first sub sensing unit in the first direction, the plurality of lines may further include a third line electrically connected to the first sub sensing unit and a fourth line electrically connected to the third sub sensing unit, and the plurality of switches may further include a third switch connected between the third line and the fourth line and a fourth switch connected between the fourth line and the driving chip.

According to some embodiments, in the first mode, the third switch may operate in an ON state, and the fourth switch operates in an OFF state, and in the second mode, the third switch may operate in an OFF state, and the fourth switch operates in an ON state.

According to some embodiments, the plurality of switches may be on the peripheral area.

According to some embodiments, the plurality of switches may be provided in the driving chip.

According to some embodiments of the inventive concept, an electronic device includes: a display layer; a sensor layer which is on the display layer, on which an active area and a peripheral area adjacent to the active area are defined, which includes a plurality of sensing units, which are on the active area and include a plurality of electrodes and a plurality of crossing electrodes insulately crossing with the plurality of electrodes, and a plurality of lines, which are on the peripheral area and respectively electrically connected to the plurality of electrodes, wherein the sensor layer senses an input by an input device; a driving chip electrically connected to the sensor layer; a first switch connected between the lines, which are electrically connected to the plurality of electrodes adjacent to each other, respectively; and a second switch connected between at least one of the plurality of lines and the driving chip, wherein the sensor layer senses a first input through a change in mutual capacitance generated between each of the plurality of electrodes and each of the plurality of crossing electrodes and senses a second input through a change in capacitance of each of the plurality of electrodes and the plurality of crossing electrodes, when the first input is sensed, the first switch operates in an ON state, and the second switch operates in an OFF state, and when the second input is sensed, the first switch operates in an OFF state, and the second switch operates in an ON state.

According to some embodiments, when the first input is sensed, the plurality of lines may be connected to each other, and when the second input is sensed, each of the plurality of lines may be connected to the driving chip.

According to some embodiments, the sensor layer may further include a plurality of cross lines on the peripheral area and respectively electrically connected to the plurality of crossing electrodes, and the electronic device may further include a third switch connected between the cross lines electrically connected to the plurality of crossing electrodes adjacent to each other and a fourth switch connected between at least one of the plurality of cross lines and the driving chip.

According to some embodiments, when the first input is sensed, the third switch may operate in an ON state, and the fourth switch operates in an OFF state, and when the second input is sensed, the third switch may operate in an OFF state, and the fourth switch operates in an ON state.

According to some embodiments, the crossing electrode may include: a first crossing portion extending in a first direction; and a plurality of second crossing portions protruding from the first crossing portion, wherein the electrode may include: a plurality of electrode patterns spaced apart from each other with the first crossing portion therebetween; and a bridge pattern insulately crossing with the first crossing portion and electrically connected to the plurality of electrode patterns.

According to some embodiments, the first crossing portion, the plurality of second crossing portions, and the plurality of electrode patterns may have a mesh structure.

According to some embodiments, the first switch and the second switch may be on the peripheral area.

According to some embodiments, the driving chip may include the first switch and the second switch.

BRIEF DESCRIPTION OF THE DRAWINGS

The accompanying drawings are included to provide a further understanding of embodiments according to the inventive concept, and are incorporated in and constitute a part of this specification. The drawings illustrate aspects of some example embodiments of the inventive concept and, together with the description, serve to explain principles of embodiments according to the inventive concept. In the drawings.

DETAILED DESCRIPTION

Figure 1:
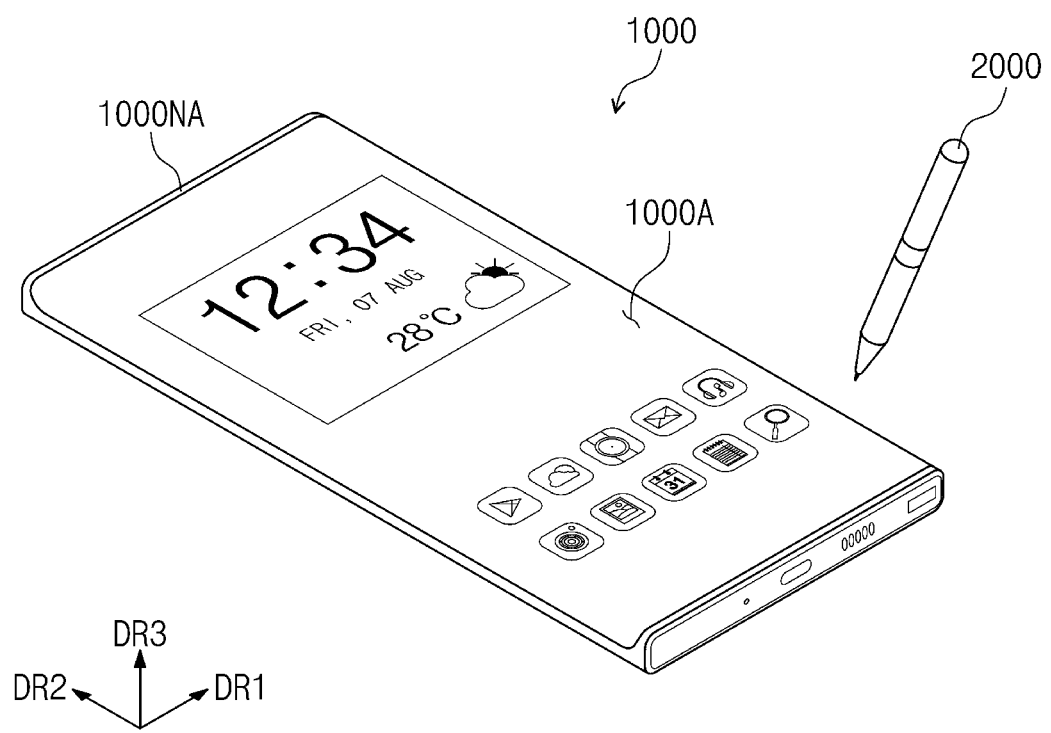
FIG. 1 is a perspective view of an electronic device according to some embodiments of the inventive concept.

In this specification, it will also be understood that when one component (or region, layer, portion) is referred to as being "on", "connected to", or "coupled to" another component, it can be directly located/arranged/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, aspects of some example embodiments of the inventive concept will be described in more detail with reference to the accompanying drawings.

FIG. 1 is a perspective view of an electronic device according to some embodiments of the inventive concept.

Referring to FIG. 1, an electronic device 1000 may be a device that is activated according to an electrical signal. For example, the electronic device 1000 may be a mobile phone, a tablet PC, a car navigation system, a game console, or a wearable device, but is not limited thereto. FIG. 1 illustrates an example in which the electronic device 100 is provided as the mobile phone, but embodiments according to the present disclosure are not limited thereto.

An active area 1000A and a peripheral area 1000NA may be defined on the electronic device 1000. The electronic device 1000 may display an image through an active area 1000A. The active area 1000A may include a surface defined by a first direction DR1 and a second direction DR2. A thickness direction of the electronic device 1000 may be parallel to a third direction DR3 crossing the first direction DR1 and the second direction DR2. Thus, a front surface (or top surface) and a rear surface (or bottom surface) of each of members constituting the electronic device 1000 may be defined based on the third direction DR3.

The peripheral area 1000NA may be located adjacent to the active area 1000A and may be, for example, a bezel area. The peripheral area 1000NA may surround the active area 1000A. However, this is merely an example, and the peripheral area 1000NA according to some embodiments of the inventive concept may be omitted.

An electronic device 1000 may sense inputs applied from the outside thereof. The external inputs may be user's inputs. The user's inputs may include various types of external inputs such as a portion of the user's body (e.g., finger or touch input), light, heat, or a pressure.

The electronic device 1000 illustrated in FIG. 1 may sense an input by a user's touch and an input by an input device 2000. The input device 2000 may refer to a device other than the user's body. For example, the input device 2000 may be an active pen, a stylus pen, a touch pen, or an electronic pen. Hereinafter, a case in which the input device 2000 is the active pen will be described as an example.

The electronic device 1000 and the input device 2000 may perform bidirectional communication. The electronic device 1000 may provide an uplink signal to the input device 2000. For example, the uplink signal may include a synchronization signal or information of the electronic device 1000, but embodiments are not particularly limited thereto. The input device 2000 may provide a downlink signal to the electronic device 1000. The downlink signal may include a synchronization signal or state information of the input device 2000. For example, the downlink signal includes coordinate information of the input device 2000, battery information of the input device 2000, inclination information of the input device 2000, and/or various information stored in the input device 2000, but embodiments are not particularly limited thereto.

Figure 2:
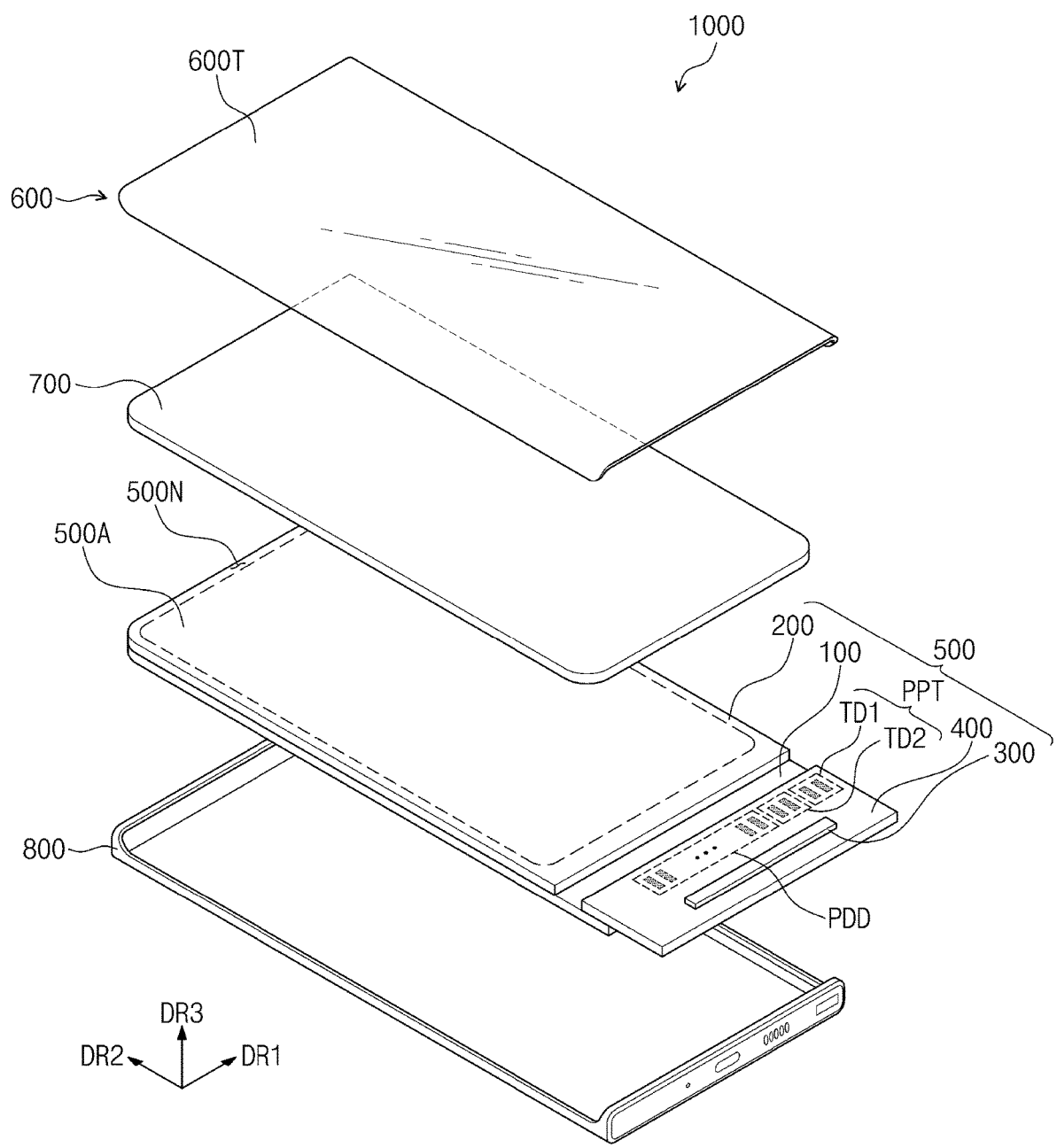
FIG. 2 is an exploded perspective view of the electronic device according to some embodiments of the inventive concept.

FIG. 2 is an exploded perspective view of the electronic device according to some embodiments of the inventive concept.

Referring to FIG. 2, the electronic device 1000 may include a window 600, an anti-reflection layer 700, an electronic module 500, and a housing 800. According to some embodiments, the window 600 and the housing 800 may be coupled to each other to define an outer appearance of the display device 1000.

The window 600 may include an optically transparent insulation material. For example, the window 600 may include glass or plastic. The window 600 may has a single-layered or multilayered structure. For example, the window 600 may include a plurality of plastic films bonded to each other by using an adhesive or include a glass substrate and a plastic film, which are bonded to each other by using an adhesive.

A transmission area 600T of the window 600 may define an entire surface of the electronic device 1000. The transmission area 600T may be an optically transparent area. For example, the transmission area 600T may be an area having a visible light transmittance of about 90% or more.

The anti-reflection layer 700 may be located below the sensor layer 600. The anti-reflection layer 700 may reduce reflectance of external light incident from an upper side of the display panel 600. The anti-reflection layer 700 according to some embodiments of the inventive concept may be omitted or may be included in the electronic module 500.

The electronic module 500 may display an image and sense an external input. An active area 500A and a peripheral area 500NA may be defined on the electronic module 500. The active area 500A may be an area that is activated according to an electrical signal.

The active area 500A may be an area on which an image is displayed, and simultaneously, the external input is sensed. The transmission area 600T may overlap the active area 500A. Thus, the user may visually recognize an image or provide an external input through the transmission region 600T. The active area 500A may overlap an active area 1000A of the electronic device 1000.

The peripheral area 500N may be an area covered by the peripheral area 1000N (see FIG. 1) of the electronic device 1000. The peripheral area 500N may be adjacent to the active area 500A. The peripheral area 500N may surround the active area 500A. A driving circuit or a driving line for driving the active area 500A may be located on the peripheral area 500N.

The electronic module 500 may include a display layer 100, a sensor layer 200, a driving chip 300, and a circuit board 400.

The display layer 100 may be a constitute that substantially generates an image. The display layer 100 may be an emissive display layer. For example, the display layer 100 may be an organic light emitting display layer, a quantum dot display layer, a micro LED display layer, or a nano LED display layer.

The sensor layer 200 may be located on the display layer 100. The sensor layer 200 may sense an external input applied from the outside.

The driving chip 300 may be electrically connected to the display layer 100 and the sensor layer 200. FIG. 2 illustrates an example in which the driving chip 300 is mounted on the circuit board 400, but the arrangement relationship of the driving chip 300 according to some embodiments of the inventive concept is not limited thereto. For example, the driving chip 300 may be mounted on the display layer 100, but is not particularly limited.

The circuit board 400 may include various driving circuits for driving the electronic device 1000 and a connector for supplying power. The circuit board 400 may be electrically connected to the display layer 100 and the sensor layer 200. The circuit board 400 according to some embodiments of the inventive concept may be a flexible circuit film or a rigid substrate. The circuit board 400 may be bent to face a rear surface of the display layer 100.

The circuit board 400 may be connected to a plurality of display pads PDD of the display layer 100. The circuit board 400 may provide an electrical signal for driving the display layer 100 to the display layer 100. The electrical signal may be generated from the circuit board 400.

The circuit board 400 may be connected to a plurality of sensing pads PDT of the display layer 100. The plurality of sensing pads PDT may include a plurality of first sensing pads TD1 and a plurality of second sensing pads TD2. The circuit board 400 may provide an electrical signal for driving the sensor layer 200 to the sensor layer 200. The electrical signal may be generated from the circuit board 400.

The housing 800 may be coupled to the window 600. The housing 800 may be coupled to the window 600 to provide an inner space (e.g., a set or predetermined inner space). The electronic module 500 may be accommodated in the inner space.

The housing 800 may include a material having relatively high rigidity. For example, the housing 800 may include glass, plastic, or a metal or may include a plurality of frames and/or plates made of a combination of glass, plastic, and a metal. The housing 800 may stably protect components of the electronic device 1000 accommodated in the internal space from external impact.

Figure 3A:
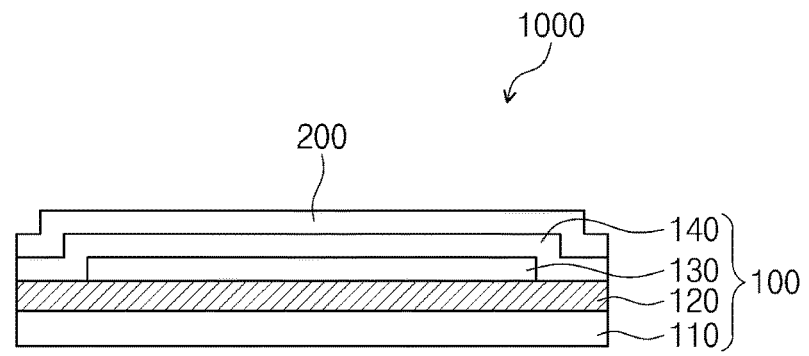
FIG. 3A is a cross-sectional view of the electronic device according to some embodiments of the inventive concept.
Figure 3A:
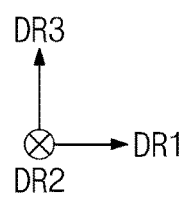

FIG. 3A is a cross-sectional view of the electronic device according to some embodiments of the inventive concept.

Referring to FIG. 3A, the electronic device 1000 may include a display layer 100 and a sensor layer 200. The display layer 100 may include a base layer 110, a circuit layer 120, a light emitting element layer 130, and an encapsulation layer 140.

The base layer 110 may be a member that provides a base surface on which a circuit layer 120 is located. The base layer 110 may be a glass substrate, a metal substrate, or a polymer substrate. However, the embodiments of the inventive concept are not limited thereto. For example, the base layer 110 may be an inorganic layer, an organic layer, or a composite layer.

The base layer 110 may have a multilayered structure. For example, the base layer 110 includes a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. The silicon oxide layer and the amorphous silicon layer may be referred to as a base barrier layer.

Each of the first and second synthetic resin layers may include a polyimide-based resin. Also, each of the first and second synthetic resin layers may include at least one of an acrylate-based resin, a methacrylate-based resin, a polyisoprene-based resin, a vinyl-based resin, an epoxy-based resin, an urethane-based resin, a cellulose-based resin, a siloxane-based resin, a polyimide-based resin, or a perylene-based resin. In this specification, the "~~"-based resin means as including a functional group of "~~".

The circuit layer 120 may be located on the base layer 110. The circuit layer 120 may include an insulating layer, a semiconductor pattern, a conductive pattern, and a signal line. The insulating layer, the semiconductor layer, and the conductive layer may be formed on the base layer 110 in a manner such as coating or vapor deposition, and then, the insulating layer, the semiconductor layer, and the conductive layer may be selectively patterned through a plurality of photolithography processes. Thereafter, the semiconductor pattern, the conductive pattern, and the signal line included in the circuit layer 120 may be provided.

A light emitting element layer 130 may be located on the circuit layer 120. The light emitting element layer 130 may include a light emitting element. For example, the light emitting element layer 130 may include an organic light emitting material, quantum dots, quantum rods, a micro LED, or a nano LED.

An encapsulation layer 140 may be located on the light emitting element layer 130. The encapsulation layer 140 may protect the display element layer 130 against foreign substances such as moisture, oxygen, and dust particles.

The sensor layer 200 may be located on the display layer 100 through a continuous process. In this case, the sensor layer 200 may be expressed as being directly arranged on the display layer 100. The direct arrangement may mean that a third component is not located between the sensor layer 200 and the display layer 100. That is, a separate adhesive member may not be located between the sensor layer 200 and the display layer 100. Alternatively, the sensor layer 200 may be bonded to the display layer 100 through an adhesive member. The adhesive member may include a common adhesive or an adhesive agent.

Figure 3B:
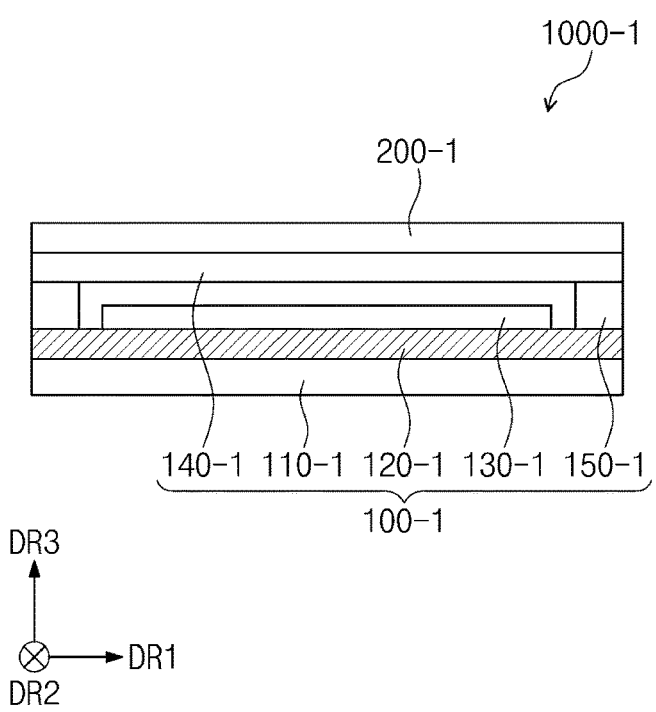
FIG. 3B is a cross-sectional view of an electronic device according to some embodiments of the inventive concept.
Figure 3B:
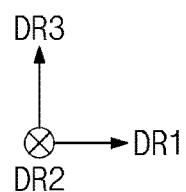

FIG. 3B is a cross-sectional view of an electronic device according to some embodiments of the inventive concept.

Referring to FIG. 3B, an electronic device 1000-1 may include a display layer 100-1 and a sensor layer 200-1. The display layer 100-1 may include a base substrate 110-1, a circuit layer 120-1, a light emitting element layer 130-1, an encapsulation substrate 140-1, and a coupling member 150-1.

Each of the base substrate 110-1 and the encapsulation substrate 140-1 may be a glass substrate, a metal substrate, or a polymer substrate, but is not particularly limited thereto.

The coupling member 150-1 may be located between the base substrate 110-1 and the encapsulation substrate 140-1. The coupling member 150-1 may couple the encapsulation substrate 140-1 to the base substrate 110-1 or the circuit layer 120-1. The coupling member 150-1 may include an inorganic material or an organic material. For example, the inorganic material may include a frit seal, and the organic material may include a photocurable resin or a photoplastic resin. However, the material forming the coupling member 150-1 is not limited to the above example.

The sensor layer 200-1 may be directly arranged on the encapsulation substrate 140-1. The direct arrangement may mean that a third component is not located between the sensor layer 200-1 and the display layer 140-1. That is, a separate adhesive member may not be located between the sensor layer 200-1 and the display layer 100-1. However, the embodiments of the inventive concept are not limited thereto. For example, an adhesive layer may be further located between the sensor layer 200-1 and the encapsulation substrate 140-1.

Figure 4:
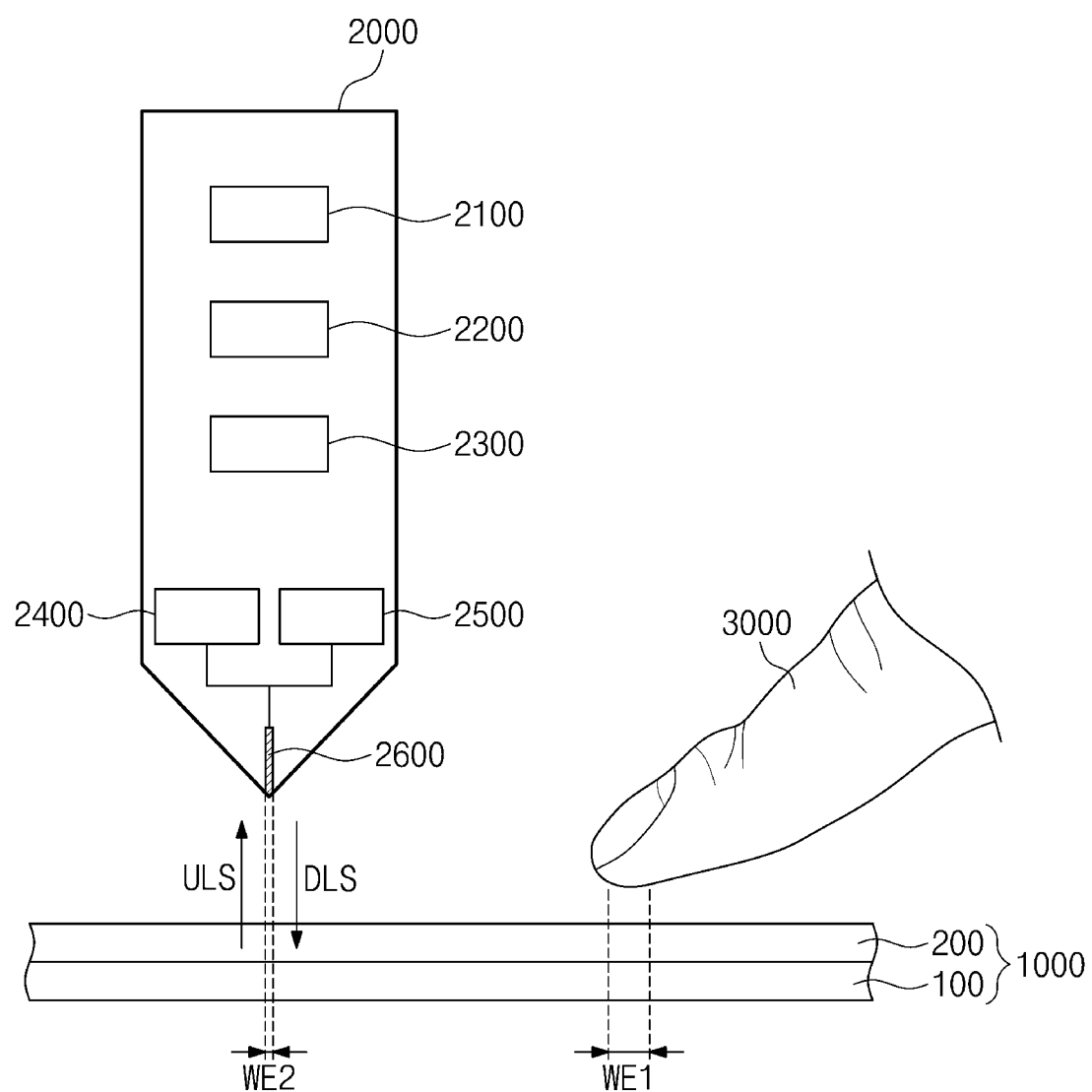
FIG. 4 is a schematic block diagram illustrating the electronic device and the input device according to some embodiments of the inventive concept.

FIG. 4 is a schematic block diagram illustrating the electronic device and the input device according to some embodiments of the inventive concept. The same constituents as that described in FIG. 2 will be denoted by the same reference numerals, and descriptions thereof will be omitted.

Referring to FIG. 4, the sensor layer 200 may sense both an input by the user's body 3000 and an input by the input device 2000.

An input area of the user's body 3000 may have a first width WE1.

The sensor layer 200 may operate by time-division driving. For example, the sensor layer 200 may be driven repeatedly alternately in a first mode and a second mode.

The first mode may be a mode for sensing the input by the user's body 3000, and the second mode may be a mode for sensing the input by the input device 2000. The first mode and the second mode will be described later.

When the second mode starts, the sensor layer 200 may provide an uplink signal ULS to the input device 2000. When the input device 2000 receives the uplink signal ULS and is synchronized with the electronic device 1000, the input device 2000 may provide a downlink signal DLS to the sensor layer 200.

The input device 2000 may include a power source 2100, a memory 2200, a controller 2300, a transmitter 2400, a receiver 2500, and a pen electrode 2600. However, components constituting the input device 2000 are not limited to the components listed above. For example, the input device 2000 may further include an electrode switch for converting the pen electrode 2600 to a signal transmission mode or a signal reception mode, a pressure sensor for sensing a pressure, a rotation sensor for sensing rotation, or the like.

An input area of the pen electrode 2600 may have a second width WE2. The second width WE2 of the input area of the pen electrode 2600 may be less than the first width WE1 of the input area of the user's body 3000.

The power source 2100 may include a battery or a high-capacity capacitor that supplies power to the input device 2000. The memory 2200 may store function information of the input device 2000. The controller 2300 may control an operation of the input device 2000. Each of the transmitter 2400 and the receiver 2500 may communicate with the electronic device 1000 through the pen electrode 2600. The transmitter 2400 may be referred to as a signal generator or a transmission circuit, and the receiver 2500 may be referred to as a signal receiver or a reception circuit.

Figure 5:
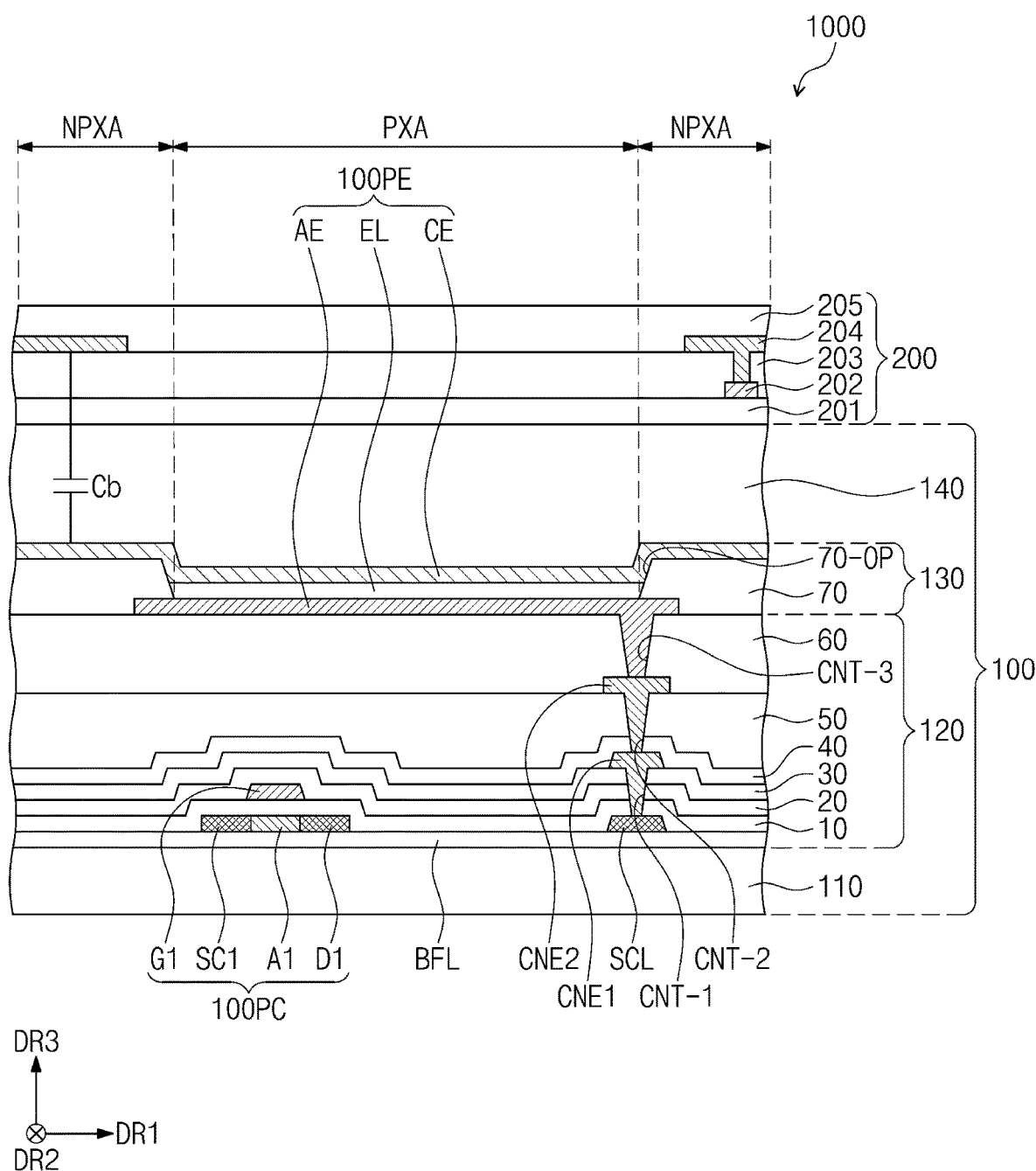
FIG. 5 is a cross-sectional view of a display module according to some embodiments of the inventive concept.

FIG. 5 is a cross-sectional view of a display module according to some embodiments of the inventive concept; In description in FIG. 5, the same reference numerals are used for the components described in FIG. 3A, and descriptions thereof are omitted.

Referring to FIG. 5, at least one inorganic layer may be located on a top surface of the base layer 110. The inorganic layer may include at least one of aluminum oxide, titanium oxide, silicon oxide silicon oxynitride, zirconium oxide, or hafnium oxide. The inorganic layer may be provided as a multilayer. The multilayered inorganic layer may constitute a barrier layer and/or a buffer layer. According to some embodiments, the display layer 100 is illustrated as including a buffer layer BFL.

The buffer layer BFL may improve bonding force between the base layer 110 and the semiconductor pattern. The buffer layer BFL may include a silicon oxide layer and a silicon nitride layer, and the silicon oxide layer and the silicon nitride layer may be alternately laminated.

The semiconductor pattern may be located on the buffer layer BFL. The semiconductor pattern may include polysilicon. However, the embodiments of the inventive concept are not limited thereto. For example, the semiconductor pattern may include amorphous silicon, low-temperature polycrystalline silicon, or an oxide semiconductor.

FIG. 5 illustrates merely a portion of the semiconductor pattern. For example, the semiconductor pattern may be further located on other areas. The semiconductor pattern may be arranged in a specific rule over pixels. The semiconductor pattern has different electrical properties depending on whether the semiconductor pattern is doped. The semiconductor pattern may include a first region having high conductivity and a second region having low conductivity. The first area may be doped with an N-type dopant or a P-type dopant. A P-type transistor may include a doped region doped with the P-type dopant, and an N-type transistor may include a doped region doped with the N-type dopant. The second region may be a non-doped region or may be doped at a concentration less than that of the first region.

The first region may have conductivity greater than that of the second region and may substantially serve as an electrode or a signal line. The second region may substantially correspond to an active (or channel) of the transistor. That is to say, a portion of the semiconductor pattern may be an active of the transistor, another portion may be a source or drain of the transistor, and further another portion may be a connection electrode or a connection signal line.

Each of the pixels may have an equivalent circuit including seven transistors, one capacitor, and a light emitting element, and an equivalent circuit diagram of the pixel may be modified in various forms. In FIG. 5, one transistor 100PC and a light emitting element 100PE provided in the pixel are illustrated as an example.

The transistor 100PC may include a source SC1, an active A1, a drain D1, and a gate G1. A source SC1, an active A1, and a drain D1 may be formed from the semiconductor pattern. The source SC1 and the drain D1 may extend in opposite directions from the active A1 on a cross-section. FIG. 5 illustrates a portion of a connection signal line SCL formed from the semiconductor pattern. Although not particularly shown, the connection signal line SCL may be connected to the drain D1 of the transistor 100PC on the plane.

A first insulating layer 10 may be located on the buffer layer BFL. The first insulating layer 10 commonly overlaps the plurality of pixels PX to cover the semiconductor pattern. The first insulating layer 10 may include an inorganic layer and/or an organic layer and have a single-layered or multilayered structure. The first insulating layer 10 may include at least one of aluminum oxide, titanium oxide, silicon oxide, silicon nitride, silicon oxynitride, zirconium oxide, or hafnium oxide. According to some embodiments, the first insulating layer 10 may include a single-layered silicon oxide layer. The insulating layer of the circuit layer 120, which will be described later, as well as the first insulating layer 10 may be an inorganic layer and/or an organic layer and may have a single-layered or a multilayered structure. The inorganic layer may include at least one of the above-described materials, but is not limited thereto.

The gate G1 is located on the first insulating layer 10. Each of the gate G1 may be a portion of a metal pattern. The gate G1 overlaps the active A1. In the process in which the semiconductor pattern is doped, the gate G1 may function as a mask.

The second insulating layer 20 may be located on the first insulating layer 10 to cover the gate G1. A second insulating layer 20 may commonly overlap the pixels. The second insulating layer 20 may be an inorganic layer and/or an organic layer and have a single-layered or multilayered structure. The second insulating layer 20 may include at least one of silicon oxide, silicon nitride, or silicon oxynitride. According to some embodiments, the second insulating layer 20 may have a multilayer structure including a silicon oxide layer and a silicon nitride layer.

A third insulating layer 30 may be located on the second insulating layer 20. The third insulating layer 30 may has a single layer or multilayer structure. For example, the third insulating layer 30 may have a multilayer structure including a silicon oxide layer and a silicon nitride layer.

A first connection electrode CNE1 may be located on the third insulating layer 30. The first connection electrode CNE1 may be connected to the signal line SCL through a contact hole CNT-1 passing through the first to third insulating layers 10 to 30.

A fourth insulating layer 40 may be located on the third insulating layer 30. The fourth insulating layer 40 may be a single-layered silicon oxide layer. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be located on the fifth insulating layer 50 to cover the second connection electrode CNE2. The sixth insulating layer 60 may be an organic layer.

A light emitting element layer 130 may be located on the circuit layer 120. The light emitting element layer 130 may include a light emitting element 100PE. For example, the light emitting element layer 130 may include an organic light emitting material, quantum dots, quantum rods, a micro LED, or a nano LED. Hereinafter, the light emitting device 100PE is described as an example of an organic light emitting element, but is not particularly limited thereto.

The light emitting element 100PE may include a first electrode AE, an emission layer EL, and a second electrode CE. The first electrode AE may be located on the sixth insulating layer 60. The first electrode AE may be connected to the second connection electrode CNE2 through a contact hole CNT-3 passing through the sixth insulating layer 60.

A pixel defining layer 70 may be located on the sixth insulating layer 60 to cover a portion of the first electrode AE. An opening 70-OP is defined in the pixel defining layer 70. The opening 70-OP of the pixel defining layer 70 exposes at least a portion of the first electrode AE.

The active area 1000A (see FIG. 1) may include an emission area PXA and a non-emission area NPXA adjacent to the emission area PXA. A non-emission area NPXA may surround the emission area PXA. According to some embodiments, an emission area PXA may be defined to correspond to a portion of an area of the first electrode AE, which is exposed by the opening 70-OP.

The emission layer EL may be located on the first electrode AE. The emission layer EL may be located on an area corresponding to the opening 70-OP. That is, the emission layer EL may be arranged to be separated from each of the pixels. When the emission layer EL is arranged to be separated from each of the pixels, each of the emission layers EL may emit light having at least one of blue, red, or green color. However, the embodiments of the inventive concept are not limited thereto. For example, the emission layer EL may be commonly provided to be connected to the pixels. In this case, the emission layer EL may provide blue light or white light.

The second electrode CE may be located on the emission layer EL. The second electrode CE may have an integrated shape and commonly located on the plurality of pixels.

According to some embodiments, a hole control layer may be located between the first electrode AE and the emission layer EL. The hole control layer may be commonly located on the emission area PXA and the non-emission area NPXA. The hole control layer may include a hole transport layer and may further include a hole injection layer. An electron control layer may be located between the emission layer EL and the second electrode CE. The electron control layer may include an electron transport layer and may further include an electron injection layer. The hole control layer and the electron control layer may be commonly formed in the plurality of pixels by using an open mask.

An encapsulation layer 140 may be located on the light emitting element layer 130. The encapsulation layer 140 may include an inorganic layer, an organic layers, and an inorganic layer, which are sequentially laminated, but layers constituting the encapsulation layer 140 are not limited thereto.

The inorganic layers may protect the light emitting element layer 130 against moisture and oxygen, and the organic layer may protect the light emitting element layer 130 against foreign substances such as dust particles. The inorganic layers may include a silicon nitride layer, a silicon oxy nitride layer, a silicon oxide layer, a titanium oxide layer, or an aluminum oxide layer. The organic layer may include an acrylic-based organic layer, but the embodiments of the inventive concept are not limited thereto.

The sensor layer 200 may be located on the display layer 100 through a continuous process. In this case, the sensor layer 200 may be expressed as being directly arranged on the display layer 100. The direct arrangement may mean that a third component is not located between the sensor layer 200 and the display layer 100. That is, a separate adhesive member may not be located between the sensor layer 200 and the display layer 100. Alternatively, the sensor layer 200 may be bonded to the display layer 110 through an adhesive member. The adhesive member may include a common adhesive or an adhesive agent.

The sensor layer 200 may include a base insulating layer 201, a first conductive layer 202, a sensing insulating layer 203, a second conductive layer 204, and a cover insulating layer 205.

The base insulating layer 201 may be an inorganic layer including at least one of silicon nitride, silicon oxynitride, or silicon oxide. Alternatively, the base insulating layer 201 may be an organic layer including an epoxy resin, an acrylic resin, or an imide-based resin. The base insulating layer 201 may have a single-layered structure or a multilayered structure in which a plurality of layers are laminated in the third direction DR3.

Each of the first conductive layer 202 and the second conductive layer 204 may have a single-layered structure or a multilayered structure in which a plurality of layers are laminated in the third directional axis DR3.

The conductive layer having the single-layered structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), indium zinc tin oxide (IZTO), or the like. In addition, the transparent conductive layer may include conductive polymers such as PEDOT, metal nanowires, graphene, and the like.

The conductive layer having the multilayered structure may include metal layers. The metal layers may have a three-layered structure of titanium/aluminum/titanium. The conductive layer having the multilayered structure may include at least one metal layer and at least one transparent conductive layer.

At least one of the sensing insulating layer 203 or the cover insulating layer 205 may include an inorganic layer. The inorganic layer may include at least one of aluminum oxide, titanium oxide, silicon oxide, silicon nitride, silicon oxynitride, zirconium oxide, or hafnium oxide.

At least one of the sensing insulating layer 203 or the cover insulating layer 205 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyimide-based resin, or a perylene-based resin.

A parasitic capacitance Cb may be generated between the sensor layer 200 and the second electrode CE. As the distance between the sensor layer 200 and the second electrode CE becomes closer, a value of the parasitic capacitance Cb may increase. As the parasitic capacitance Cb increases, a ratio of change in amount of capacitance to the reference value may decrease. The change in capacitance may mean a change in capacitance that occurs before and after an input by the input unit, for example, the input device 2000 (see FIG. 4) or the user's body 3000 (see FIG. 4).

The driving chip 300 (see FIG. 2) processing the signal sensed from the sensor layer 200 may perform a leveling operation of removing a value corresponding to the parasitic capacitance Cb from the sensed signal. The ratio of change in amount of capacitance to the reference value may increase to sensing sensitivity by the leveling operation.

However, there may be a difference in ability to remove a value corresponding to the parasitic capacitance Cb according to a specification of the driving chip 300 (see FIG. 2). For example, if a maximum parasitic capacitance Cb is about 500 picofarads, and the capacitance value that is capable be being removed from the signal sensed from the sensor layer 200 by the driving chip 300 (see FIG. 2) is about 200 picofarads, a reference value may not be sufficiently lowered by the driving chip 300 (see FIG. 2). In this case, a ratio of the amount of change in capacitance compared to the reference value is insignificant, and thus, a malfunction in which the driving chip 300 (see FIG. 2) does not recognize the amount of change in capacitance as noise or does not recognize the touch coordinates may occur. According to the inventive concept, the electrode structure of the sensor layer 200 may be modified to provide the maximum value of the parasitic capacitance Cb as a value (e.g., a set or predetermined value) or less. In this case, even when performance of the driving chip 300 (see FIG. 2) is relatively low, accuracy of the coordinate recognition may be improved. The value (e.g., the set or predetermined value) may be about 200 picofarads, but is not particularly limited thereto.

Figure 6:
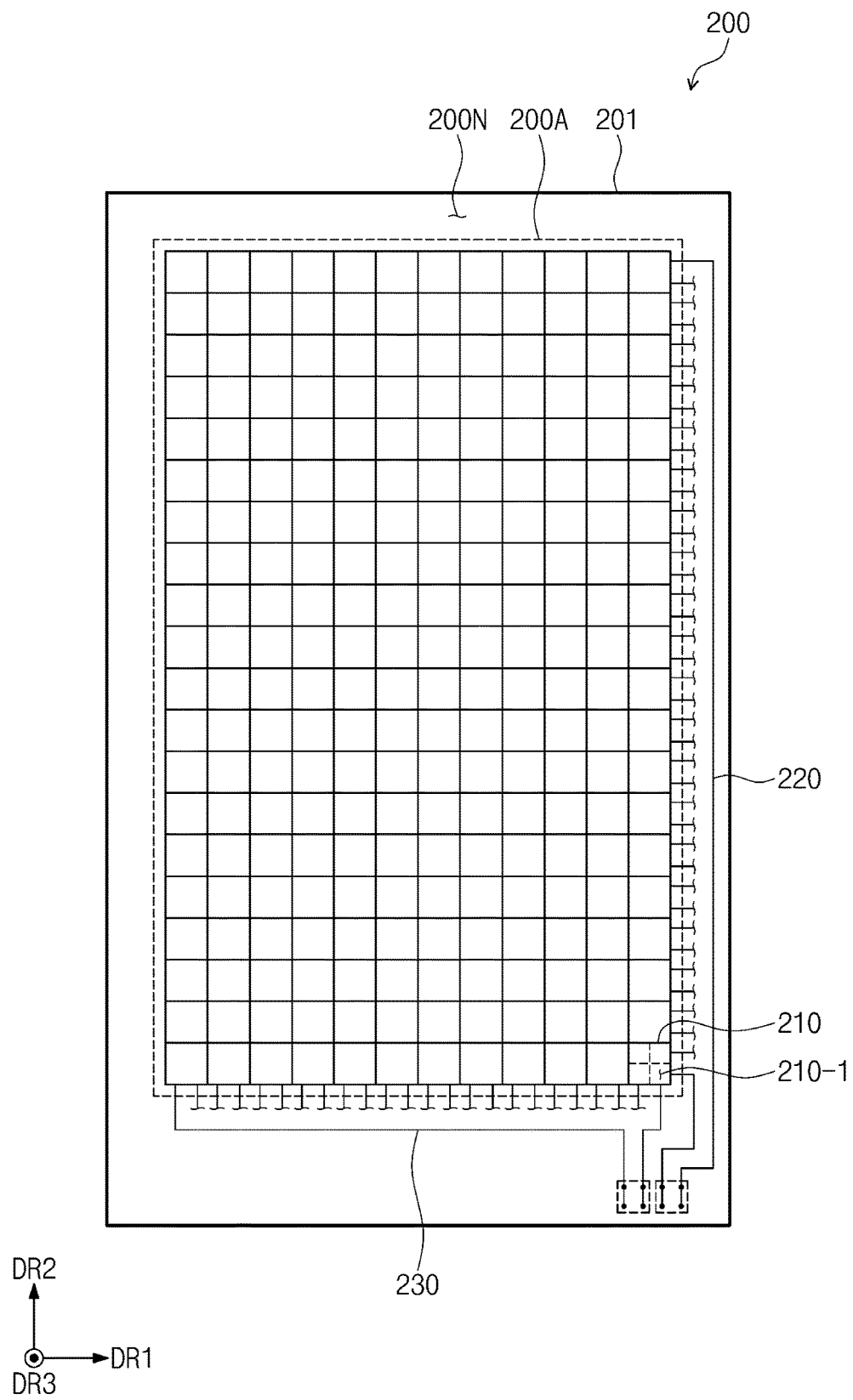
FIG. 6 is a plan view of a sensor layer according to some embodiments of the inventive concept.

FIG. 6 is a plan view of the sensor layer according to some embodiments of the inventive concept.

Referring to FIG. 6, an active area 200A and a peripheral area 200N may be defined on the sensor layer 200. The active area 200A may be an area that is activated according to an electrical signal. For example, the active area 200A may be an area that senses an input. The active area 200A may overlap the active area 500A (see FIG. 2) of the electronic module 500 (see FIG. 2). The peripheral area 200N may surround the active area 200A. The peripheral area 200N may overlap the peripheral area 500NA (see FIG. 2) of the electronic module 500 (see FIG. 2).

The sensor layer 200 may include a base insulating layer 201, a plurality of sensing units 210, a plurality of lines 220, and a plurality of cross lines 230. The plurality of sensing units 210 may be located on the active area 200A. The plurality of lines 220 and the plurality of cross lines 230 may be located on the peripheral area 200N. The plurality of cross lines 230 may also be referred to as a plurality of lines 230.

Each of the plurality of sensing units 210 may include a plurality of sub sensing units 210-1. FIG. 6 illustrates an example in which one sensing unit 210 includes four sub sensing units 210-1, but the number of plurality of sub sensing units 210-1 included in one sensing unit 210 according to some embodiments of the inventive concept is not limited thereto. For example, one sensing unit 210 may include 9 or 16 sub sensing units 210-1.

The plurality of sensing units 210 may be arranged in the first direction DR1 and the second direction DR2.

The plurality of lines 220 and the plurality of cross lines 230 may be electrically connected to each of the plurality of sub sensing units 210-1.

The plurality of lines 220 may be electrically connected to the plurality of first sensing pads TD1 (see FIG. 2) through contact holes, respectively. The plurality of cross lines 230 may be electrically connected to the plurality of second sensing pads TD2 (see FIG. 2) through contact holes, respectively.

Figure 7A:
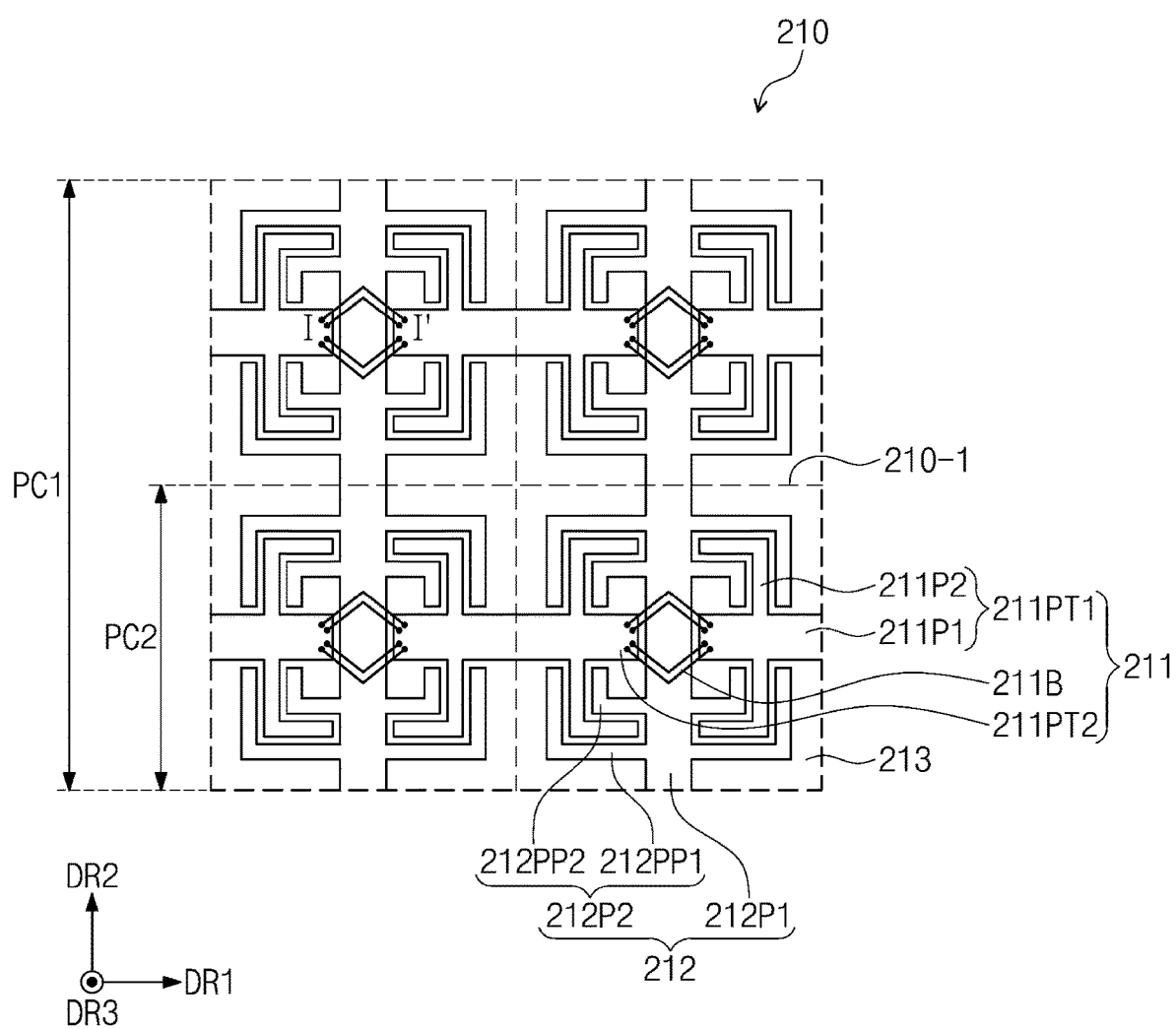
FIG. 7A is a plan view illustrating one of a plurality of sensing units according to some embodiments of the inventive concept.
Figure 7B:
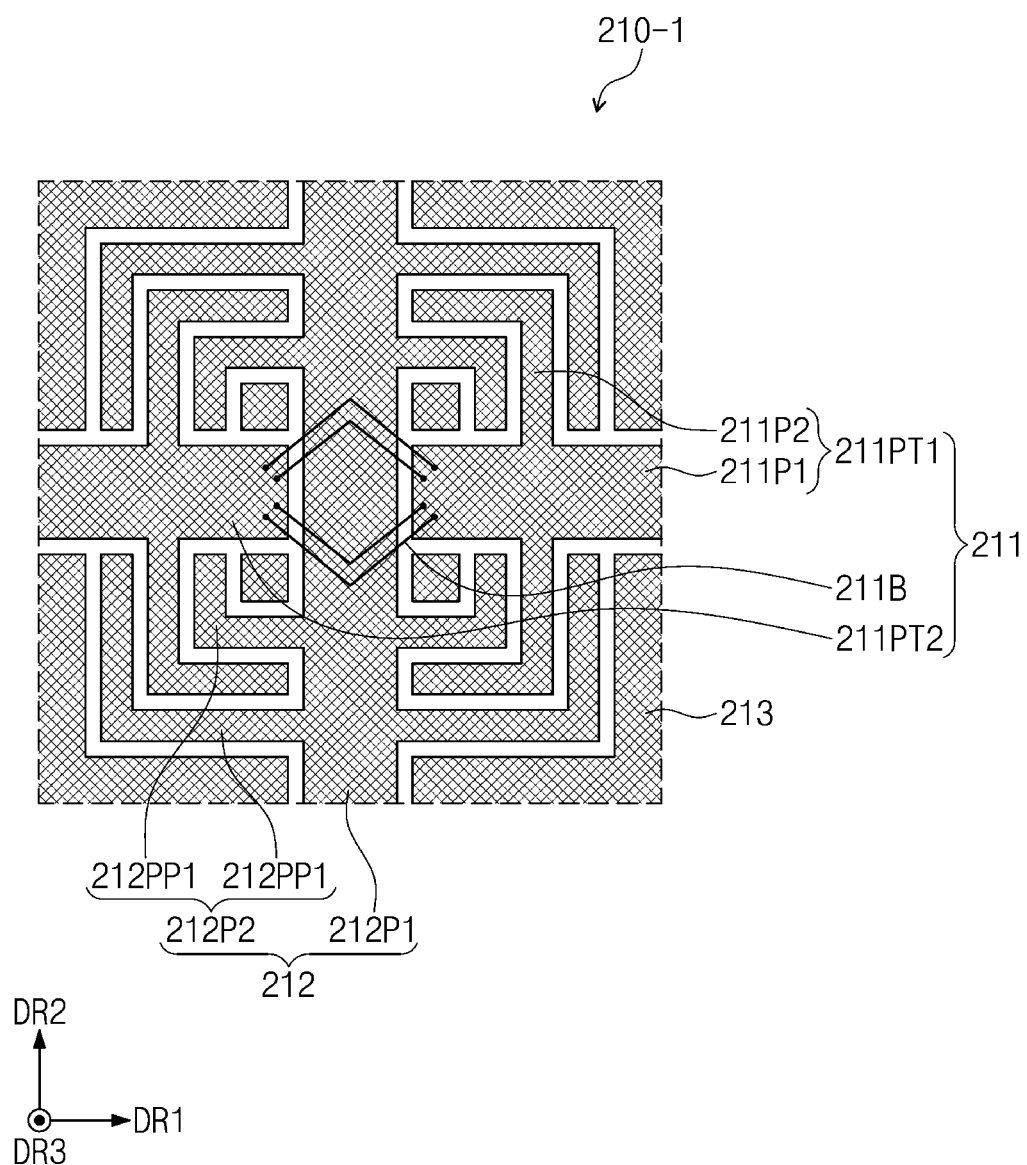
FIG. 7B is a plan view illustrating one of a plurality of sub sensing units according to some embodiments of the inventive concept.
Figure 7C:
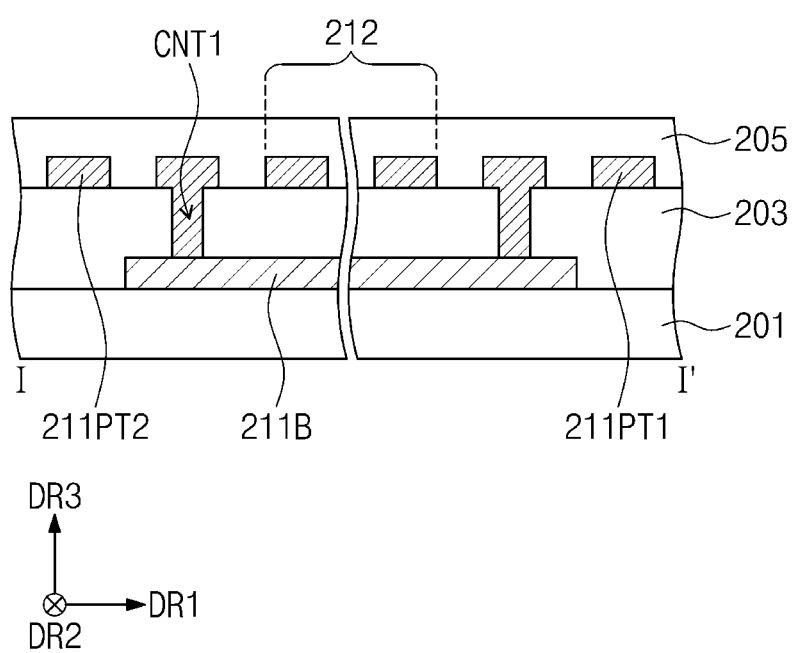
FIG. 7C is a cross-sectional view taken along line I-I' of FIG. 7A according to some embodiments of the inventive concept.

FIG. 7A is a plan view illustrating one of the plurality of sensing units according to some embodiments of the inventive concept, FIG. 7B is a plan view illustrating one of the plurality of sub sensing units according to some embodiments of the inventive concept, and FIG. 7C is a cross-sectional view taken along the line I-I' of FIG. 7A according to some embodiments of the inventive concept.

Referring to FIGS. 7A to 7C, the plurality of sensing units 210 may have a first pitch PC1. The first pitch PC1 of the plurality of sensing units 210 may be less than the first width WE1 (see FIG. 4) of the input area of the user's body 3000 (see FIG. 4), but is not specifically limited thereto. The first pitch PC1 may be about 3.5 mm to about 4.5 mm. For example, the first pitch PC1 may be about 4 mm. According to some embodiments of the inventive concept, an area of each of the plurality of sensing units 210 may be less than that of the input area of the user's body 3000 (see FIG. 2). Thus, the sensor layer 200 may accurately sense coordinates inputted by the user's body 3000 (see FIG. 2).

For example, one sensing unit 210 may include a plurality of sub sensing units 210-1. The plurality of sub sensing units 210-1 may be arranged in the first direction DR1 and the second direction DR2. For example, four sub sensing units 210-1 may be provided.

The plurality of sub sensing units 210-1 may have a second pitch PC2. The second pitch PC2 of the plurality of sub sensing units 210-1 may be less than the second width WE2 of the pen electrode 2600 (see FIG. 2) of the input device 2000 (see FIG. 2), but is not particularly limited thereto. The second pitch PC2 may be about 1.0 mm to about 2.0 mm. For example, the second pitch PC2 may be about 1.5 mm. According to some embodiments of the inventive concept, the area of each of the plurality of sub sensing units 210-1 may be less than that of the input area of the pen electrode 2600 (see FIG. 2) of the input device 2000 (see FIG. 2). Thus, the sensor layer 200 (see FIG. 4) may accurately sense coordinates inputted by the input device 2000 (see FIG. 2).

Each of the sub sensing unit 210-1 may include an electrode 211, an crossing electrode 212, and a plurality of dummy electrodes 213.

The electrode may extend in the first direction DR1. The crossing electrode 212 may extend in the second direction DR2. The electrode 211 may be insulately crossing with the crossing electrode 212. The term "insulately crossing" or "insulately crosses" or other similar phrases in the present disclosure refer to two elements crossing, overlapping, or intersecting in a plan view, without being electrically connected to each other at the point of intersection in the plan view, such that there may be an insulating material or gap between the two elements.

The dummy electrode 213 may surround the electrode 211 and the crossing electrode 212. As the dummy electrode 213 is located, a difference in transmittance or reflectance between a portion at which the electrode 211 or the crossing electrode 212 is located and a portion at which the electrode 211 or the crossing electrode 212 is not located may be reduced. As a result, a phenomenon in which a specific boundary, for example, a boundary between the electrode 211 and the crossing electrode 212 or a boundary between the portion at which the electrode 211 or the crossing electrode 212 are located or the portion at which the electrode 211 or the crossing electrode 212 is not located, is visually recognized may be prevented or reduced.

When viewed on a plan, an area on which the electrode 211 and the crossing electrode 212 overlap the second electrode CE (see FIG. 5) may be reduced by the dummy electrode 213. According to the inventive concept, the value of the parasitic capacitance Cb (see FIG. 5) may be reduced. Thus, the sensing sensitivity for the amount of change in capacitance of the sensor layer 200 (see FIG. 6) may be improved.

The electrode 211 may include a plurality of electrode patterns 211PT1 and 211PT2 and a plurality of bridge patterns 212B.

The plurality of electrode patterns 211PT1 and 211PT2 may include a first electrode pattern 211PT1 and a second electrode pattern 211PT2, which are spaced apart from each other with a first crossing portion 212P1 therebetween.

The first electrode pattern 211PT1 may include a first portion 211P1 and a plurality of second portions 211P2.

The first portion 211P1 may extend in the first direction DR1. The plurality of second portions 211P2 may protrude from the first portion 211P1. The first portion 211P1 and the plurality of second portions 211P2 may be provided to be integrated with each other. The plurality of second portions 211P2 may include a plurality of first pattern portions protruding from the first portion 211P1 to extend in the second direction DR2 and a plurality of second pattern portions respectively protruding from the plurality of first pattern portions to extend in the first direction DR1.

The second electrode pattern 211PT2 may have a shape symmetrical to the first electrode pattern 211PT1 with respect to an axis extending in the second direction DR2.

The first electrode pattern 211PT1 of one sub sensing unit 210-1 and the second electrode pattern 211PT2 of the other sensing unit 210-1 in two sub sensing units 210-1 adjacent to each other in the first direction DR1 may be provided to be integrated with each other.

The plurality of bridge patterns 211B may be electrically connected to the plurality of electrode patterns 211PT1 and 211PT2. The plurality of bridge patterns 211B may insulately crossing with the first crossing portion 212P1.

The crossing electrode 212 may include a plurality of first crossing portions 212P1 and a plurality of second crossing portions 212P2.

The first crossing portion 212P1 may extend in the second direction DR2. The plurality of second crossing portions 212P2 may protrude from the first crossing portion 212P1. The first crossing portion 212P1 and the plurality of second crossing portions 212P2 may be provided to be integrated with each other.

The plurality of second crossing portions 212P2 may include a first crossing pattern portion 212PP1 and a second crossing pattern portion 212PP2.

The first crossing pattern portion 212PP1 may surround the second portion 211P2. The second portion 211P2 may surround the second crossing portions 212P2. The first crossing pattern portion 212PP1, the second crossing pattern portion 212PP2, and the second portion 211P2 may be located adjacent to each other. A length of a boundary between the first crossing pattern portion 212PP1, the second crossing pattern portion 212PP2, and the second portion 211P2 may increase. According to some embodiments of the inventive concept, mutual capacitance between the electrode 211 and the crossing electrode 212 may increase. As the mutual capacitance increases, the amount of change in mutual capacitance may increase. Thus, the sensing sensitivity of the sensor layer 200 (see FIG. 6) may be improved.

Referring to FIG. 7B, the first crossing portion 212P1, the plurality of second crossing portions 212P2, and the plurality of electrode patterns 211PT1 and 211PT2 may have a mesh structure.

The bridge pattern 211B may be located on the base insulating layer 201. The sensing insulating layer 203 may be located on the base insulating layer 201. The sensing insulating layer 203 may cover the bridge pattern 211B. The sensing insulating layer 203 may include an inorganic material, an organic material, or a composite material.

The first electrode pattern 211PT1, the second electrode pattern 211PT2, and the crossing electrode 212 may be located on the sensing insulating layer 203.

A plurality of first contact holes CNT1 may be defined to pass through the sensing insulating layer 203 in the third direction DR3. The first electrode pattern 211PT1 and the second electrode pattern 211PT2 may be electrically connected to the bridge pattern 211B through the plurality of first contact holes CNT1.

The cover insulating layer 205 may be located on the sensing insulating layer 203. The cover insulating layer 205 may cover the first electrode pattern 211PT1, the second electrode pattern 211PT2, and the crossing electrode 212. The cover insulating layer 205 may include an inorganic material, an organic material, or a composite material.

FIG. 7B illustrates a bottom bridge structure in which the bridge pattern 211B is located below the first electrode pattern 211PT1, the second electrode pattern 211 PT2, and the crossing electrode 211, but the structure of the sensor layer 200 (see FIG. 6) according to some embodiments of the inventive concept is not limited thereto. For example, the sensing layer 200 (see FIG. 6) according to some embodiments of the inventive concept may have a top bridge structure in which the bridge pattern 211B is located on the first electrode pattern 211PT1, the second electrode pattern 211PT2, and the crossing electrode 212.

Figure 8:
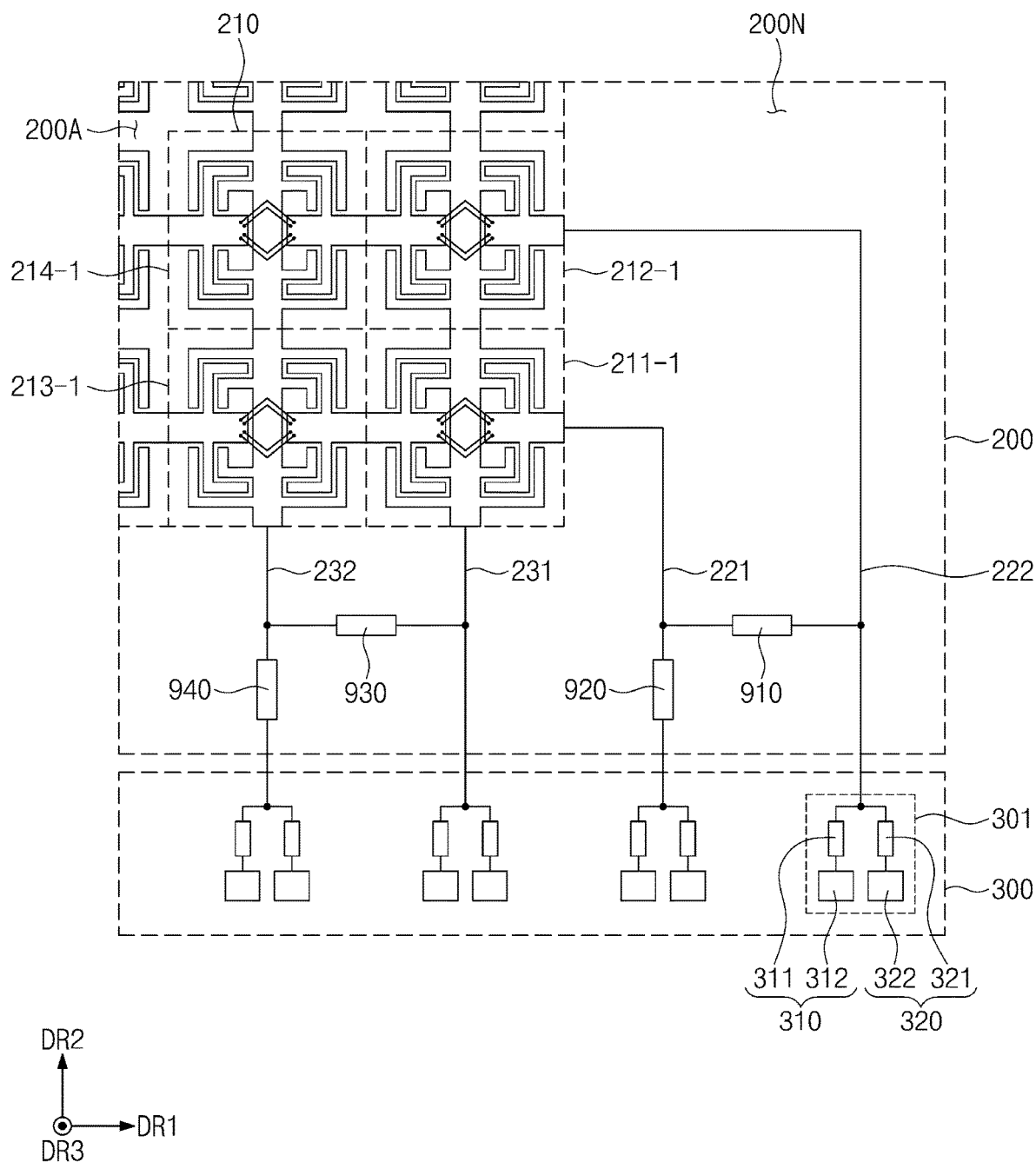
FIG. 8 is a plan view of an electronic device according to some embodiments of the inventive concept.

FIG. 8 is a plan view of an electronic device according to some embodiments of the inventive concept.

Referring to FIGS. 6 and 8, the plurality of sub sensing units 210-1 may include a first sub sensing unit 211-1, a second sub sensing unit 212-1, and a third sub sensing unit 213-1, and a fourth sub sensing unit 214-1.

The second sub sensing unit 212-1 may be spaced apart from the first sub sensing unit 211-1 in the second direction DR2. The third sub sensing unit 213-1 may be spaced apart from the first sub sensing unit 211-1 in the first direction DR1. The fourth sub sensing unit 214-1 may be spaced apart from the second sub sensing unit 212-1 in the first direction DR1 and be separated from the third sub sensing unit 213-1 in the second direction DR2.

The plurality of lines 220 may include a first line 221 and a second line 222.

The first line 221 may be electrically connected to the electrodes 211 (see FIG. 7A) of the first and third sub sensing units 211-1 and 213-1. The second line 222 may be electrically connected to the electrode 211 (see FIG. 7A) of each of the second sub sensing unit 212-1 and the fourth sub sensing unit 214-1.

The plurality of cross lines 230 may include a first cross line 231 and a second cross line 232. The first cross line 231 may also be referred to as a third line 231. The second cross line 232 may also be referred to as a fourth line 232.

The first cross line 231 may be electrically connected to the crossing electrode 212 (see FIG. 7A) of each of the first sub sensing unit 211-1 and the second sub sensing unit 212-1. The second cross line 232 may be electrically connected to the crossing electrode 212 (see FIG. 7A) of each of the third sub sensing unit 213-1 and the fourth sub sensing unit 214-1.

The driving chip 300 may be electrically connected to the sensor layer 200. The driving chip 300 may include a plurality of driving circuits 301. The plurality of driving circuits 301 may be connected to the first line 221, the second line 222, the first cross line 231, and the second cross line 232, respectively.

Each of the plurality of driving circuits 301 may include a first driving circuit 310 and a second driving circuit 320.

The first driving circuit 310 may include a first driving switch 311 and a first driving part 312. The second driving circuit 320 may include a second driving switch 321 and a second driving part 322.

The electronic device 1000 (see FIG. 1) may further include a plurality of switches 910, 920, 930, and 940. The plurality of switches 910, 920, 930, and 940 may be located on the peripheral area 200N. The plurality of switches 910, 920, 930, 940 may include a first switch 910, a second switch 920, a third switch 930, and a fourth switch 940.

The first switch 910 may be connected between the first line 221 and the second line 222. The second switch 920 may be connected between the first line 221 and the driving chip 300. However, this is merely an example, and the connection relationship of the second switch 920 according to some embodiments of the inventive concept is not limited thereto. For example, the second switch 920 may be connected between the second line 222 and the driving chip 300.

The third switch 930 may be connected between the first cross line 231 and the second cross line 232. The fourth switch 940 may be connected between the second cross line 232 and the driving chip 300. However, this is merely an example, and the connection relationship between the fourth switch 940 according to some embodiments of the inventive concept is not limited thereto. For example, the fourth switch 940 may be connected between the first cross line 231 and the driving chip 300.

Figure 9:
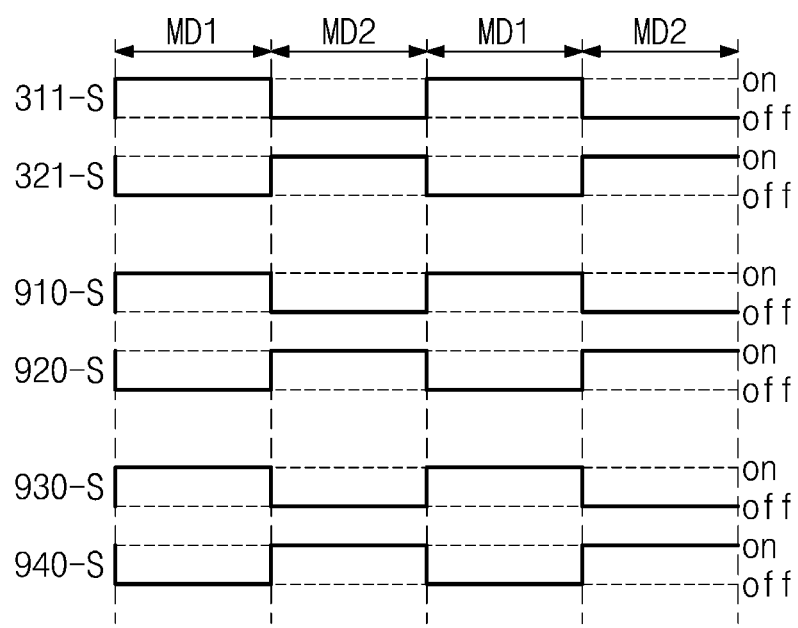
FIG. 9 is a view illustrating operations of a plurality of switches and a plurality of driving switches according to some embodiments of the inventive concept.

FIG. 9 is a view illustrating operations of the plurality of switches and the plurality of driving switches according to some embodiments of the inventive concept.

Referring to FIGS. 8 and 9, the sensor layer 200 may operate in a first mode MD1 or a second mode MD2. The first mode MD1 and the second mode MD2 may alternately repeatedly operate.

The sensor layer 200 may sense an input by the user's body 300 (see FIG. 4) through a change in mutual capacitance generated between the electrode 211 (see FIG. 7A) and the crossing electrode 212 (see FIG. 7A) in the first mode MD1. The input by the user's body 3000 (see FIG. 4) may be referred to as a first input.

The sensor layer 200 may sense an input by the input device 2000 (see FIG. 4) through a change in capacitance of each of the electrodes 211 (see FIG. 7A) and the crossing electrode 212 (see FIG. 7A) in the second mode MD2. The input by the input device 2000 (see FIG. 4) may be referred to as a second input.

The first driving switch 311 may be controlled by a first driving switch signal 311-S. The first driving switch signal 311-S may allow the first driving switch 311 to operate in an ON state or an OFF state. The first driving switch 311 may operate in the ON state in the first mode MD1 and may operate in the OFF state in the second mode MD2 by the first driving switch signal 311-S.

The second driving switch 321 may be controlled by a second driving switch signal 321-S. The second driving switch signal 321-S may allow the second driving switch 321 to operate in an ON state or an OFF state. The second driving switch 321 may operate in the OFF state in the first mode MD1 and may operate in the ON state in the second mode MD2 by the second driving switch signal 321-S.

The first switch 910 may be controlled by a first switch signal 910-S. The first switch signal 910-S may allow the first switch 910 to operate in an ON state or an OFF state. The first switch 910 may operate in the ON state in the first mode MD1 and may operate in the OFF state in the second mode MD2 by the first switch signal 910-S.

The second switch 920 may be controlled by a second switch signal 920-S. The second switch signal 920-S may allow the second switch 920 to operate in an ON state or an OFF state. The second switch 920 may operate in the OFF state in the first mode MD1 and may operate in the ON state in the second mode MD2 by the second switch signal 920-S.

The third switch 930 may be controlled by a third switch signal 930-S. The third switch signal 930-S may allow the third switch 930 to operate in an ON state or an OFF state. The third switch 930 may operate in the ON state in the first mode MD1 and may operate in the OFF state in the second mode MD2 by the third switch signal 930-S.

The fourth switch 940 may be controlled by a fourth switch signal 940-S. The fourth switch signal 940-S may allow the fourth switch 940 to operate in an ON state or an OFF state. The fourth switch 940 may operate in the OFF state in the first mode MD1 and may operate in the ON state in the second mode MD2 by the fourth switch signal 940-S.

Figure 10:
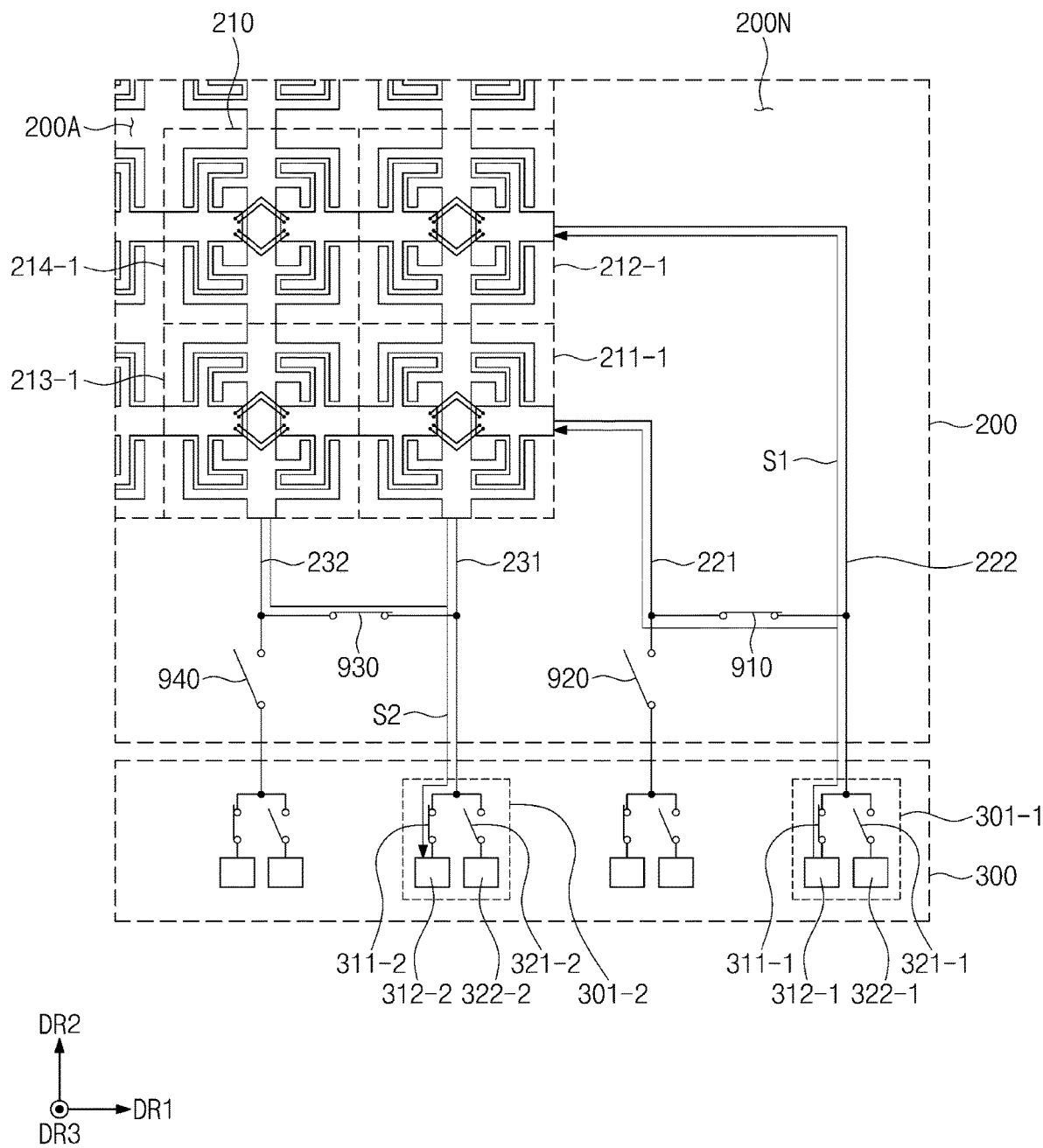
FIG. 10 is a view of the electronic device that operates in a first mode according to some embodiments of the inventive concept.

FIG. 10 is a view of the electronic device that operates in the first mode according to some embodiments of the inventive concept. In describing FIG. 10, the same reference numerals are used for the components described through FIG. 8, and descriptions thereof will be omitted.

Referring to FIGS. 9 and 10, the sensor layer 200 may operate in a first mode MD1.

In the first mode MD1, the first switch 910 and the third switch 930 may operate in an ON state, and the second switch 920 and the fourth switch 940 may operate in an OFF state.

That the first switch 910 and the third switch 930 operate in the ON state may mean that each of the first switch 910 and the third switch 930 is in a closed state. The first line 221 and the second line 222 may be connected to each other by the first switch 910. The first cross line 231 and the second cross line 232 may be connected to each other by the third switch 930.

That the second switch 920 and the fourth switch 940 operate in the OFF state may mean that each of the second switch 920 and the fourth switch 940 is in an opened state.

The first line 221 and the second line 222 may be electrically connected to the same first driving circuit 301-1 by the first switch 910 and the second switch 920.

The first cross line 231 and the second cross line 232 may be electrically connected to the same second driving circuit 301-2 by the third switch 930 and the fourth switch 940.

In the first mode MD1, a first driving switch 311-1 of the first driving circuit 301-1 may operate in the ON state by the first driving switch signal 311-S, and a second driving switch 321-1 may operate in the OFF state by the second driving switch signal 321-S.

That the first driving switch 311-1 operates in the ON state may mean that the first driving switch 311-1 is in a closed state. A first driving part 312-1 may be electrically connected to the first line 221 and the second line 222 by the first driving switch 311-1.

That the second driving switch 321-1 operates in the OFF state may mean that the second driving switch 321-1 is in an opened state. A second driving part 322-1 may not be electrically connected to the first line 221 and the second line 222 by the second driving switch 321-1.

The first driving part 312-1 of the first driving circuit 301-1 may provide an output signal S1 to the electrode 211 (see FIG. 7A).

In the first mode MD1, a second driving switch 311-2 of the first driving circuit 301-2 may operate in the ON state by the first driving switch signal 311-S, and a second driving switch 321-2 may operate in the OFF state by the second driving switch signal 321-S.

That the first driving switch 311-2 operates in the ON state may mean that the first driving switch 311-2 is in a closed state. A first driving part 312-2 may be electrically connected to the first cross line 231 and the second cross line 232 by the first driving switch 311-2.

That the second driving switch 321-2 operates in the OFF state may mean that the second driving switch 321-2 is in an opened state. A second driving part 322-2 may not be electrically connected to the first cross line 231 and the second cross line 232 by the second driving switch 321-2.

The first driving part 312-2 of the second driving circuit 301-2 may receive a sensing signal S2 from the crossing electrode 212 (see FIG. 7A).

In the first mode MD1, the sensor layer 200 may sense an input based on each of the plurality of sensing units 210.

In the first mode MD1, the first driving part 312-1 may provide an output signal S1 to the electrode 211. The first driving part 312-2 may receive a sensing signal S2 from the crossing electrode 212. That is, in the second mode MD2 (see FIG. 1), the electrode 211 may function as a transmission electrode, and the crossing electrode 212 may function as a reception electrode. However, this is merely an example, and the operations of the electrode 211 and the crossing electrode 212 according to some embodiments of the inventive concept are not limited thereto. For example, in the first mode MD1, the crossing electrode 212 may operate as a transmission electrode, and the electrode 211 may operate as a reception electrode. In the first mode MD1, the first driving parts 312-1 and 312-2 may sense a change in mutual capacitance generated between the electrode 211 and the crossing electrode 212 to sense an external input.

According to the inventive concept, the first line 221 and the second line 222 may be connected by the first switch 910 to provide the output signal S1 to each of the plurality of sensing units 210. The first cross line 231 and the second cross line 232 may be connected by the third switch 930 to receive the sensing signal S2 from each of the plurality of sensing units 210. The first driving part 312-2 may receive a relatively larger signal when compared to a case in which a signal is received from each of the plurality of sub sensing units 210-1 by the first cross line 231 and the second cross line 232, which are connected to each other. It may be easy to detect the user's body 3000 (see FIG. 4). Thus, sensing reliability of the sensor layer 200 for the user's body 3000 (see FIG. 4) may be improved.

Also, according to the inventive concept, when the user's body 3000 (see FIG. 4) is sensed, the input area of the user's body 3000 (see FIG. 4), which overlaps the sensor layer 200, may cover the sensing unit 210. An amount of change in mutual capacitance between the electrode 211 and the crossing electrode 212, which is sensed by the user's body 3000 (see FIG. 4), may be constantly sensed even when the user's body 3000 (see FIG. 4) moves. Thus, the sensing reliability and coordinate accuracy of the sensor layer 200 for the user's body 3000 (see FIG. 4) may be improved.

Figure 11:
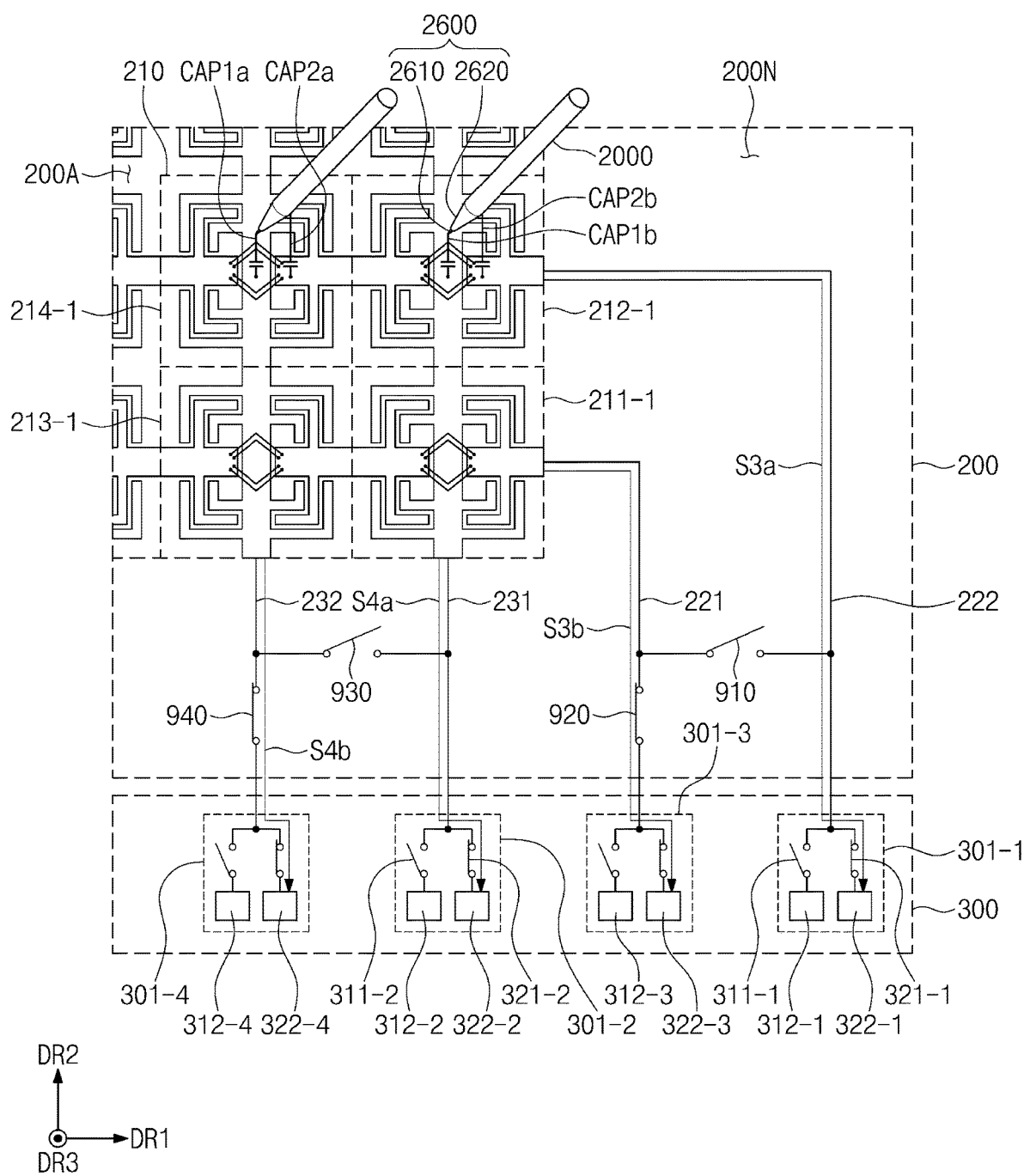
FIG. 11 is a view of the electronic device that operates in a second mode according to some embodiments of the inventive concept.

FIG. 11 is a view of the electronic device that operates in the second mode according to some embodiments of the inventive concept. In describing FIG. 11, the same reference numerals are used for the components described through FIG. 8, and descriptions thereof will be omitted.

Referring to FIGS. 9 and 11, the sensor layer 200 may operate in the second mode MD2.

In the second mode MD2, the first switch 910 and the third switch 930 may operate in an OFF state, and the second switch 920 and the fourth switch 940 may operate in an ON state.

That the first switch 910 and the third switch 930 operate in the OFF state may mean that each of the first switch 910 and the third switch 930 in in an opened state.

That the second switch 920 and the fourth switch 940 operate in the ON state may mean that each of the second switch 920 and the fourth switch 940 is in a closed state.

The first line 221, the second line 222, the first cross line 231, and the second cross line 232 may be electrically connected to the plurality of driving circuits 301 (see FIG. 8) by the second switch 920 and the fourth switch 940, respectively.

In the second mode MD2, the first driving switch 311 (see FIG. 8) of each of the plurality of driving circuits 301 (see FIG. 8) may operate in the OFF state by the first driving switch signal 311-S, and the second driving switch 321 (see FIG. 8) may operate in the ON state by the second driving switch signal 321-S.

The plurality of driving circuits 301 (see FIG. 8) may include a first driving circuit 301-1, a second driving circuit 301-2, a third driving circuit 301-3, and a fourth driving circuit 301-4.

That the first driving switch 311 (see FIG. 8) operates in the OFF state may mean that the first driving switch 311 (see FIG. 8) is in an opened state.

The first driving part 312-1 of the first driving circuit 301-1 may not be connected to the first line 221. The first driving part 312-2 of the second driving circuit 301-2 may not be connected to the first cross line 231. The first driving part 312-3 of the third driving circuit 301-3 may not be connected to the second line 222. The first driving part 312-4 of the fourth driving circuit 301-4 may not be connected to the second cross line 232.

That the second driving switch 321 (see FIG. 8) operate in the ON state may mean that the second driving switch 321 (see FIG. 8) is in a closed state.

The second driving part 322-1 of the first driving circuit 301-1 may be electrically connected to the first line 221. The second driving part 322-2 of the second driving circuit 301-2 may be electrically connected to the first cross line 231. The second driving part 322-3 of the third driving circuit 301-3 may be electrically connected to the second line 222. The second driving part 322-4 of the fourth driving circuit 301-4 may be electrically connected to the second cross line 232. That is, the plurality of second driving parts 322 (see FIG. 8) of the driving chip 300 may be electrically connected to the first line 221, the second line 222, the first cross line 231, and the second cross line 232, respectively.

In the second mode MD2, the sensor layer 200 may sense an input based on each of the plurality of sub sensing units 210-1. When the input device 2000 is sensed, the input area of the input device 2000, which overlaps the sensor layer 200, may cover one sub sensing unit 210-1. As each of the plurality of sub sensing units 210-1 (see FIG. 8) for recognizing the input device 2000 is covered by the input device 2000, sensing accuracy of the sensor layer 200 with respect to the input device 2000 may be improved.

The second driving part 322 (see FIG. 8) of each of the plurality of driving circuits 301 (see FIG. 8) may receive sensing signals S3a, S3b, S4a, and S4b induced from the input device 2000. Here, the electrode 211 (see FIG. 7A) and the crossing electrode 212 (see FIG. 7A) of each of the plurality of sub sensing units 210-1 (see FIG. 8) may be used as reception electrodes that provide the sensing signals S3a, S3b, S4a, and S4b to the second driving part 322 (see FIG. 8). However, this is merely an example, and the electrode 211 (see FIG. 7A) and the crossing electrode 212 (see FIG. 7A) of each of the plurality of sub sensing units 210-1 (see FIG. 8) may be used as transmission electrodes that provide input uplink signals to the input device 2000. That is, in the second mode MD2, both the electrode 211 (see FIG. 7A) and the crossing electrode 212 (see FIG. 7A) may be used as the transmission electrodes or the reception electrodes.

The pen electrode 2600 may include a first pen electrode 2610 and a second pen electrode 2620. The first pen electrode 2610 may be located at one end of the input device 2000. The second pen electrode 2620 may be located on a side surface of the input device 2000. The sensor layer 200 may acquire coordinates of the input device 2000 through the first pen electrode 2610 and acquire an inclination of the input device 2000 through the second pen electrode 2620.

Also, according to the inventive concept, a difference between first capacitance CAP2a sensed by a first pen electrode 2610 when the input device 2000 is located at a first position within one sensing unit 210 and second capacitance CAP2b sensed by a second pen electrode 2610 when the input device 2000 is located at a second position within the other sensing unit 210 (see FIG. 8) may be reduced. The capacitance of each of the electrode 211 and the crossing electrode 212, which is sensed by the input device 2000, may be constantly sensed even if the input device 2000 moves. That is, the coordinate accuracy and the sensing reliability of the sensor layer 200 may be improved in an input provided in the form of a line such as when writing a character or drawing a picture using the input device 2000. As a result, linearity of the input may be improved.

Also, according to the inventive concept, a difference between first capacitance CAP2a sensed by the second pen electrode 2620 when the input device 2000 is located at the first position and second capacitance CAP2b sensed by the second pen electrode 2620 when the input device 2000 is located at the second position may be reduced. That is, a deviation in capacitance between the input device 2000 and the sensor layer 200 according to the positions of the input device 2000 within one sensing unit 210 may be reduced. Thus, inclination accuracy and sensing reliability of the sensor layer 200 for the input device 2000 may be improved.

Figure 12:
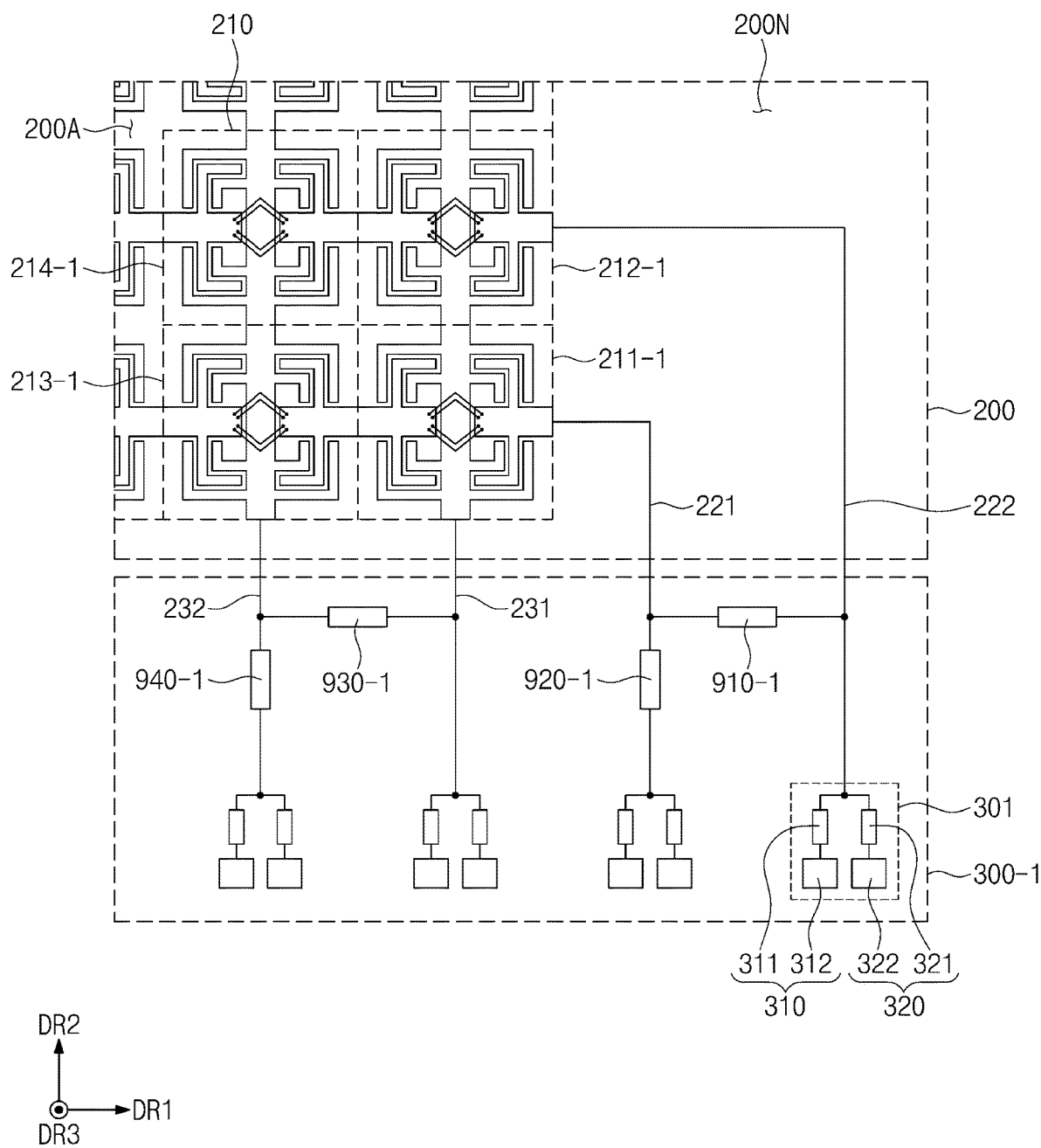
FIG. 12 is a plan view illustrating a portion of the electronic device according to some embodiments of the inventive concept.

FIG. 12 is a plan view illustrating a portion of the electronic device according to some embodiments of the inventive concept. In describing FIG. 12, the same reference numerals are used for the components described through FIG. 8, and descriptions thereof will be omitted.

Referring to FIG. 12, a first switch 910-1, a second switch 920-1, a third switch 930-1, and a fourth switch 940-1 may be included in a driving chip 300-1. An area of the peripheral area 200N of the sensor layer 200 may be reduced. Therefore, it is possible to implement a narrow bezel.

According to some embodiments of the inventive concept, the sensor layer including the plurality of sensing areas, each of which includes the plurality of sub sensing units, may sense the input by the user's body and the input device. The input area of the user's body may cover the sensing unit. When the input is inputted by the user's body, the sensor layer may sense the input based on the sensing unit by the plurality of switches. Thus, when compared to the case in which the signal is received from each of the plurality of sub sensing units, the larger signal may be received. Therefore, the sensing reliability of the sensor layer with respect to the user's body may be improved. The input area of the input device may cover the sub sensing unit. When the input is inputted by the input device, the sensor layer may sense the input based on the sub sensing unit by the plurality of switches. As the sub sensing unit for recognizing the input device is covered by the input device, the sensing accuracy of the sensor layer with respect to the input device may be improved.

It will be apparent to those skilled in the art that various modifications and deviations can be made in the present invention. Thus, it is intended that the present disclosure covers the modifications and deviations of this invention provided they come within the scope of the appended claims and their equivalents. Accordingly, the technical scope of the present invention should not be limited to the contents described in the detailed description of the specification, but should be determined by the claims.

What is claimed is:

1. An electronic device comprising:
    a display layer;
    a sensor layer on the display layer and having an active area and a peripheral area adjacent to the active area;
    a driving chip electrically connected to the sensor layer; and
    a plurality of switches connected between the sensor layer and the driving chip,
    wherein the sensor layer comprises a plurality of sensing units on the active area and a plurality of lines on the peripheral area and respectively electrically connected to the plurality of sensing units,
    each of the plurality of sensing units comprises a plurality of sub sensing units arranged in a first direction and a second direction crossing the first direction,
    the plurality of sub sensing units comprise a first sub sensing unit and a second sub sensing unit spaced apart from the first sub sensing unit in the second direction,
    the plurality of lines comprise a first line electrically connected to the first sub sensing unit and a second line electrically connected to the second sub sensing unit,
    the plurality of switches comprises a first switch connected between the first line and the second line and a second switch connected between the first line and the driving chip,
    wherein each of the plurality of sub sensing units comprises an electrode and a crossing electrode that insulately crosses with the electrode, wherein the crossing electrode comprises:
a first crossing portion extending in the second direction; and
a plurality of second crossing portions protruding from the first crossing portion,
wherein the electrode comprises:
a plurality of electrode patterns spaced apart from each other with the first crossing portion therebetween; and
a bridge pattern insulately crossing with the first crossing portion and electrically connected to the plurality of electrode patterns.

2. The electronic device of claim 1, wherein the sensor layer is configured to operate in a first mode or a second mode different from the first mode, such that
in the first mode, the first switch operates in an ON state, and the second switch operates in an OFF state, and
in the second mode, the first switch operates in an OFF state, and the second switch operates in an ON state.

3. The electronic device of claim 2, wherein the driving chip comprises a plurality of first driving parts configured to operate in the first mode and a plurality of second driving parts configured to operate in the second mode.

4. The electronic device of claim 3, wherein, in the first mode, the first line and the second line are configured to be connected to each other, and
in the second mode, the plurality of lines are configured to be electrically connected to the plurality of second driving parts, respectively.

5. The electronic device of claim 2, wherein, in the first mode, the sensor layer is configured to sense an input based on each of the plurality of sensing units, and
in the second mode, the sensor layer is configured to sense an input based on each of the plurality of sub sensing units.

6. The electronic device of claim 2, wherein each of the plurality of sub sensing units comprises an electrode and a crossing electrode that insulately crosses with the electrode,
the sensor layer is configured to sense an input by touch through a change in mutual capacitance generated between the electrode and the crossing electrode in the first mode, and
the sensor layer is configured to sense an input by an input device through a change in capacitance of each of the electrode and the crossing electrode in the second mode.

7. The electronic device of claim 1, wherein the first crossing portion, the plurality of second crossing portions, and the plurality of electrode patterns have a mesh structure.

8. The electronic device of claim 2, wherein the plurality of sub sensing units further comprise a third sub sensing unit spaced apart from the first sub sensing unit in the first direction,
the plurality of lines further comprise a third line electrically connected to the first sub sensing unit and a fourth line electrically connected to the third sub sensing unit, and
the plurality of switches further comprise a third switch connected between the third line and the fourth line and a fourth switch connected between the fourth line and the driving chip.

9. The electronic device of claim 8, wherein, in the first mode, the third switch operates in an ON state, and the fourth switch operates in an OFF state, and
in the second mode, the third switch operates in an OFF state, and the fourth switch operates in an ON state.

10. The electronic device of claim 1, wherein the plurality of switches are at the peripheral area.

11. The electronic device of claim 1, wherein the plurality of switches are located in the driving chip.

12. An electronic device comprising:
a display layer;
a sensor layer on the display layer and having an active area and a peripheral area adjacent to the active area, the sensor layer comprising a plurality of sensing units on the active area and comprising a plurality of electrodes and a plurality of crossing electrodes insulately crossing with the plurality of electrodes, and a plurality of lines on the peripheral area and respectively electrically connected to the plurality of electrodes, wherein the sensor layer is configured to sense an input by an input device;
a driving chip electrically connected to the sensor layer;
a first switch connected between the lines, which are electrically connected to the plurality of electrodes adjacent to each other, respectively; and
a second switch connected between at least one of the plurality of lines and the driving chip,
wherein the sensor layer is configured to sense a first input through a change in mutual capacitance generated between each of the plurality of electrodes and each of the plurality of crossing electrodes and to sense a second input through a change in capacitance of each of the plurality of electrodes and the plurality of crossing electrodes,
in response to the first input being sensed, the first switch operates in an ON state, and the second switch operates in an OFF state, and
in response to the second input being sensed, the first switch operates in an OFF state, and the second switch operates in an ON state,
wherein a crossing electrode from among the plurality of crossing electrodes comprises:
a first crossing portion extending in a first direction; and
a plurality of second crossing portions protruding from the first crossing portion,
wherein an electrode from among the plurality of electrodes comprises:
a plurality of electrode patterns spaced apart from each other with the first crossing portion therebetween; and
a bridge pattern insulately crossing with the first crossing portion and electrically connected to the plurality of electrode patterns.

13. The electronic device of claim 12, wherein, in response to the first input being sensed, the plurality of lines are connected to each other, and
in response to the second input being sensed, each of the plurality of lines is connected to the driving chip.

14. The electronic device of claim 12, wherein the sensor layer further comprises a plurality of cross lines on the peripheral area and respectively electrically connected to the plurality of crossing electrodes, and
the electronic device further comprises a third switch connected between the cross lines electrically connected to the plurality of crossing electrodes adjacent to each other and a fourth switch connected between at least one of the plurality of cross lines and the driving chip.

15. The electronic device of claim 14, wherein, in response to the first input being sensed, the third switch operates in an ON state, and the fourth switch operates in an OFF state, and
in response to the second input being sensed, the third switch operates in an OFF state, and the fourth switch operates in an ON state.

16. The electronic device of claim 12, wherein the first crossing portion, the plurality of second crossing portions, and the plurality of electrode patterns have a mesh structure.

17. The electronic device of claim 12, wherein the first switch and the second switch are on the peripheral area.

18. The electronic device of claim 13, wherein the driving chip comprises the first switch and the second switch.

* * * * *